US012681074B2

(12) United States Patent
An et al.

(10) Patent No.: US 12,681,074 B2
(45) Date of Patent: Jul. 14, 2026

(54) METHOD FOR PREDICTING DEFECT IN SEMICONDUCTOR DEVICE

(71) Applicant: Samsung Electronics Co., Ltd., Suwon-si (KR)

(72) Inventors: Taeyoon An, Hwaseong-si (KR); Sangwoon Lee, Seoul (KR); Sungjin Kim, Hwaseong-si (KR); Seunghyun Kim, Seoul (KR); Wonki Roh, Yongin-si (KR); Chulwoo Park, Seoul (KR); Seongjae Byeon, Suwon-si (KR); Joohyun Jeon, Hwaseong-si (KR); Hyoeun Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1317 days.

(21) Appl. No.: 17/495,487

(22) Filed: Oct. 6, 2021

(65) Prior Publication Data

US 2022/0268830 A1 Aug. 25, 2022

(30) Foreign Application Priority Data

Feb. 23, 2021 (KR) ........................ 10-2021-0023950

(51) Int. Cl.
*G01R 31/28* (2006.01)
*G01T 1/24* (2006.01)
(Continued)

(52) U.S. Cl.
CPC ............ *G01R 31/2848* (2013.01); *G01T 1/24* (2013.01); *G06F 30/20* (2020.01); *G06N 20/00* (2019.01);
(Continued)

(58) Field of Classification Search
CPC ....... G01R 31/2848; G01T 1/24; G06F 30/20; G06F 2119/02; G06F 2119/22;
(Continued)

(56) References Cited

U.S. PATENT DOCUMENTS 7,550,730 B1 6/2009 Cannon et al.
10,878,922 B1 * 12/2020 Ray ........................ G11C 5/005
(Continued)

FOREIGN PATENT DOCUMENTS

CN 103870664 A 6/2014
CN 105572720 A 5/2016
(Continued)

*Primary Examiner* — Zhipeng Wang
(74) *Attorney, Agent, or Firm* — Wolf, Greenfield & Sacks, P.C.

(57) ABSTRACT

A method for predicting a defect in a semiconductor device includes: calculating a first probability that particles will be generated in a semiconductor element by radiation; calculating a second probability that damage will occur in the semiconductor element due to the particles; generating a training data set using input data and simulation data, the input data including damage data generated using the first probability and the second probability and including at least one of a position in which the damage will occur and an amount of the damage, impurity concentration of impurities doped in at least a portion of the semiconductor element, and structural data of the semiconductor element, and the simulation data including electrical characteristics of the semiconductor element obtained as a result of a simulation based on the input data; and training a machine learning model based on the training data set to generate a defect prediction model.

11 Claims, 19 Drawing Sheets

ALTITUDE

3

(51) Int. Cl.

| | |
|---|---|
| *G06F 30/20* | (2020.01) |
| *G06N 20/00* | (2019.01) |
| *G06T 7/00* | (2017.01) |
| *H10P 72/00* | (2026.01) |

(52) U.S. Cl.
CPC ........ *G06T 7/0008* (2013.01); *H10P 72/0616*
(2026.01); *G06T 2207/20081* (2013.01)

(58) Field of Classification Search
CPC .......... G06F 30/25; G06N 20/00; G06N 7/01;
G06T 7/0008; G06T 2207/20081; H01L
21/67288; H01L 22/20; H10B 12/30;
H10D 1/68
See application file for complete search history.

(56) References Cited

U.S. PATENT DOCUMENTS

| | | | |
|---|---|---|---|
| 2010/0217570 A1* | 8/2010 | Charruau | G01R 31/2848 |
| | | | 703/2 |
| 2019/0065630 A1* | 2/2019 | Kim | G06F 17/18 |
| 2020/0019661 A1 | 1/2020 | Spaltmann et al. | |
| 2022/0230901 A1* | 7/2022 | Ditali | H01L 21/67386 |

FOREIGN PATENT DOCUMENTS

| | | |
|---|---|---|
| CN | 105787227 A | 7/2016 |
| CN | 109657370 A | 4/2019 |
| KR | 10-2020-0088012 A | 7/2020 |

* cited by examiner

ALTITUDE

20

| NUMBER OF PARTICLES | | FIRST PROCESS | SECOND PROCESS | THIRD PROCESS |
|---|---|---|---|---|
| FIRST REGION | FIRST PARTICLE | 74 | 46 | 74 |
| | SECOND PARTICLE | 87 | 54 | 87 |
| SECOND REGION | FIRST PARTICLE | 9 | 9 | – |
| | SECOND PARTICLE | 9 | 9 | – |
| SUM | | 179 | 118 | 161 |

FIG. 7

| DAMAGE OCCURRENCE PROBABILITY | | FIRST PROCESS | SECOND PROCESS | THIRD PROCESS |
|---|---|---|---|---|
| FIRST REGION | FIRST PARTICLE | 1.23% | 1.12% | 1.23% |
| | SECOND PARTICLE | 1.94% | 2.22% | 1.94% |
| SECOND REGION | FIRST PARTICLE | 1% | 1% | – |
| | SECOND PARTICLE | 4.4% | 4.4% | – |

FIG. 8

| AMOUNT OF DAMAGE | | FIRST PROCESS | SECOND PROCESS | THIRD PROCESS |
|---|---|---|---|---|
| FIRST REGION | FIRST PARTICLE | 0.91 | 0.52 | 0.91 |
| | SECOND PARTICLE | 1.69 | 1.2 | 1.69 |
| SECOND REGION | FIRST PARTICLE | 0.09 | 0.09 | – |
| | SECOND PARTICLE | 0.40 | 0.40 | – |
| SUM | | 3.08 | 2.2 | 2.6 |

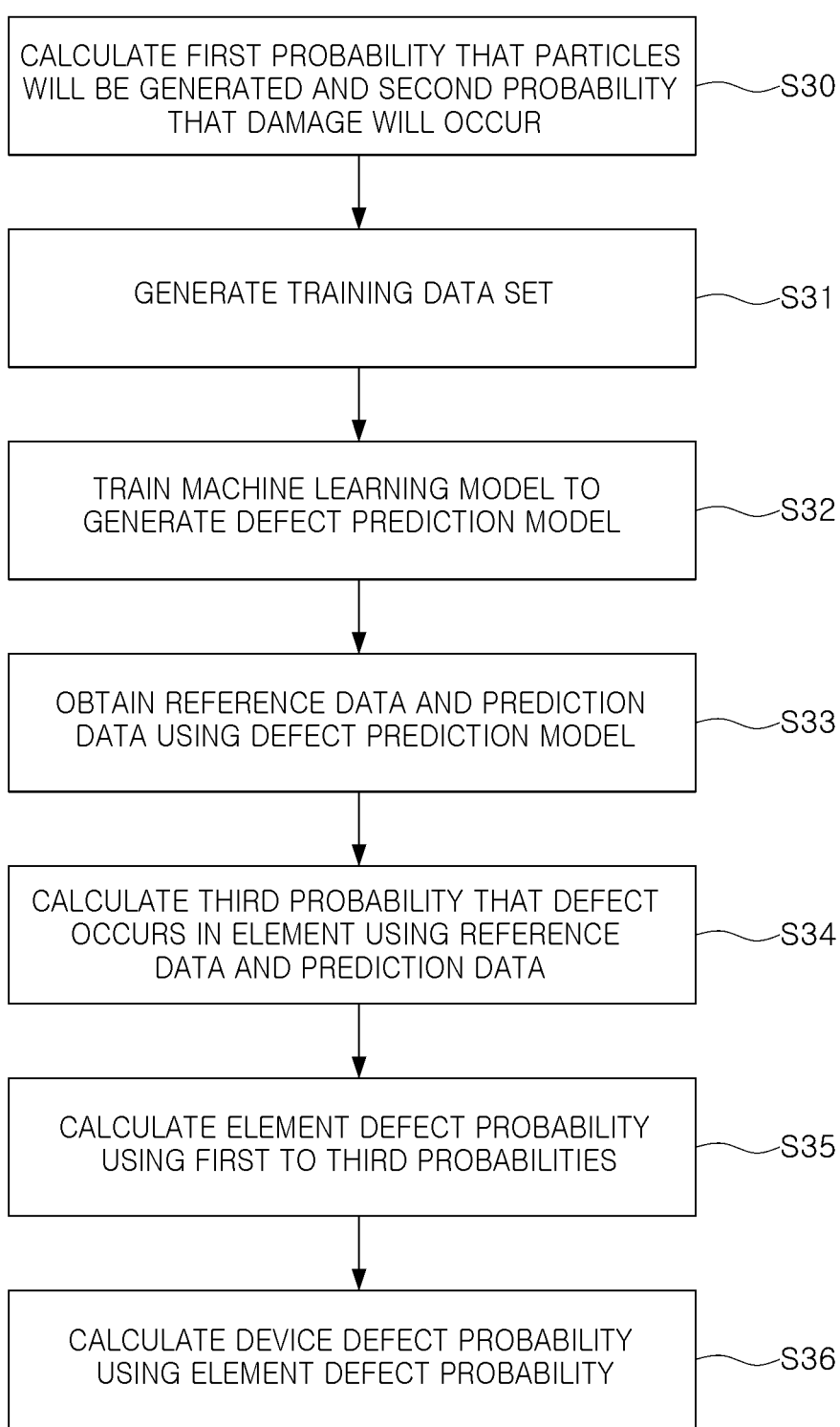

CALCULATE FIRST PROBABILITY THAT PARTICLES WILL BE GENERATED AND SECOND PROBABILITY THAT DAMAGE WILL OCCUR — S30

GENERATE TRAINING DATA SET — S31

TRAIN MACHINE LEARNING MODEL TO GENERATE DEFECT PREDICTION MODEL — S32

OBTAIN REFERENCE DATA AND PREDICTION DATA USING DEFECT PREDICTION MODEL — S33

CALCULATE THIRD PROBABILITY THAT DEFECT OCCURS IN ELEMENT USING REFERENCE DATA AND PREDICTION DATA — S34

CALCULATE ELEMENT DEFECT PROBABILITY USING FIRST TO THIRD PROBABILITIES — S35

CALCULATE DEVICE DEFECT PROBABILITY USING ELEMENT DEFECT PROBABILITY — S36

FIG. 23

METHOD FOR PREDICTING DEFECT IN SEMICONDUCTOR DEVICE

CROSS-REFERENCE TO RELATED APPLICATION(S)

This application claims benefit of priority under 35 U.S.C. § 119 to Korean Patent Application No. 10-2021-0023950 filed on Feb. 23, 2021, in the Korean Intellectual Property Office, the disclosure of which is incorporated herein by reference in its entirety.

BACKGROUND

The present disclosure relates to a method for predicting a defect in a semiconductor device.

Semiconductor devices, shipped from a production line, may be delivered to users through various transportation means. When semiconductor devices are exported overseas, transportation means such as ships and aircraft may be used. Aircraft have an advantage of fast transportation while being expensive. However, when semiconductor devices are transported by an aircraft, the semiconductor devices may be affected by radiation, depending on a route and an altitude of the aircraft, and a defect may occur in a product due to the radiation.

SUMMARY

Example embodiments provide a defect prediction model of a semiconductor device that may predict radiation, which may affect a semiconductor device during transportation, through simulation and may accurately predict a probability that defects due to radiation may occur in semiconductor elements that are included in the semiconductor device.

According to an example embodiment of the present disclosure, a method for predicting a defect in a semiconductor device includes: calculating a first probability that particles will be generated in a semiconductor element of the semiconductor device by radiation; calculating a second probability that damage will occur in the semiconductor element due to the particles; generating a training data set using input data and simulation data, the input data including damage data generated using the first probability and the second probability and including at least one of a position in which the damage will occur and an amount of the damage, an impurity concentration of impurities doped in at least a portion of the semiconductor element, and structural data of the semiconductor element, and the simulation data including electrical characteristics of the semiconductor element obtained as a result of a simulation based on the input data; and training a machine learning model based on the training data set to generate a defect prediction model.

According to an example embodiment of the present disclosure, a method for predicting a defect in a semiconductor device using a defect prediction model includes: obtaining reference data on resistance of a semiconductor element of the semiconductor device under conditions in which damage caused by radiation has not occurred; inputting input data of conditions in which damage caused by radiation has occurred to the defect prediction model to obtain prediction data on the resistance of the semiconductor element; predicting an element defect probability of the semiconductor element caused by damage from radiation using the reference data and the prediction data; and calculating a device defect probability of the semiconductor device including the semiconductor element using the element defect probability.

According to an example embodiment of the present disclosure, a method for predicting a defect in a semiconductor device includes: calculating a first probability that particles will be generated in a semiconductor element of the semiconductor device by radiation and a second probability that damage in the semiconductor element will occur due to the particles; generating a training data set including input data and reference data, the input data including a position in which damage will occur in the semiconductor element, an impurity concentration of impurities doped in at least a portion of the semiconductor element, and structural data of the semiconductor element and the reference data including a resistance of the semiconductor element; training a machine learning model based on the training data set to generate a defect prediction model; inputting reference input data of conditions in which damage caused by radiation has not occurred and prediction input data of conditions in which data caused by radiation has occurred, respectively, to the defect prediction model to obtain reference data on characteristics of the semiconductor element and prediction data; calculating a third probability that a defect will occur in the semiconductor element, using the reference data and the prediction data; and calculating an element defect probability of the semiconductor element using the first probability, the second probability, and the third probability.

BRIEF DESCRIPTION OF DRAWINGS

The above and other aspects, features, and advantages of the present disclosure will be more clearly understood from the following detailed description, taken in conjunction with the accompanying drawings.

FIGS. 7 to 9 are diagrams illustrating a method for calculating a damage occurrence probability in a semiconductor device according to an example embodiment of the present disclosure.

FIG. 23 is a flowchart illustrating a defect prediction method according to an example embodiment of the present disclosure.

DETAILED DESCRIPTION

Hereinafter, example embodiments of the present disclosure will be described with reference to the accompanying drawings.

Figure 1:
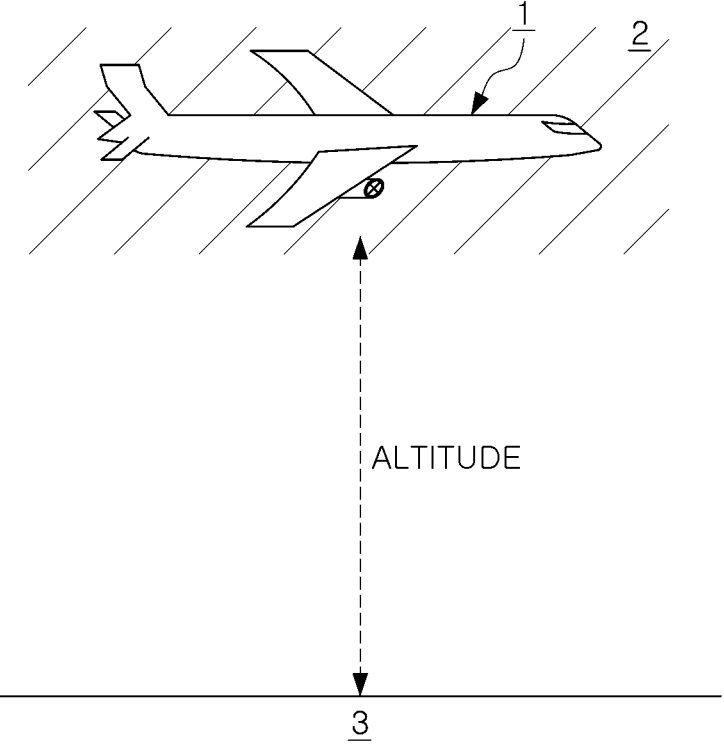
FIG. 1 is a diagram illustrating a method for transporting semiconductor devices according to an example embodiment of the present disclosure.

FIG. 1 is a diagram illustrating a method for transporting semiconductor devices according to an example embodiment of the present disclosure.

According to the example embodiment illustrated in FIG. 1, semiconductor devices produced and shipped on a production line may be transported by an aircraft 1. The aircraft 1 may be selected as a transportation means for exporting semiconductor devices to foreign countries, and has an advantage in terms of fast transportation of semiconductor devices although aircraft are expensive as compared with the sea transportation means.

The aircraft 1 may fly at a predetermined altitude from the ground 3, and thus, may be significantly affected by radiation 2, as compared with land transportation means and sea transportation means. The amount of radiation 2, to which the aircraft 1 is exposed, may be determined depending on latitude and longitude of a route through which the aircraft 1 flies, altitude of the aircraft 1, or the like.

Thermal neutrons, high-speed neutrons, and the like, may be generated by radiation, and at least some of materials included in semiconductor device transported to the aircraft 1 may absorb neutrons to cause nuclear fission. Particles may be generated as a result of the nuclear fission. The generated particles may move within a semiconductor device, and may collide with silicon, or the like, included in the semiconductor device, to cause damage. The damage may cause a vacancy defect, or the like. The vacancy defect may result in a change in characteristics (for example, resistance, and the like) of a semiconductor element. Accordingly, defects may occur in the semiconductor element and a semiconductor device including the semiconductor element.

Since defects caused by radiation occur while semiconductor devices are transported by the aircraft 1, the defects may be found in an environment in which a user uses the semiconductor device, rather than in the product shipment stage. In an example embodiment, a probability that a defect occurs in a semiconductor device due to radiation, exposed in a process such as transportation in a product shipment stage, may be predicted using a defect prediction model. In addition, a probability of occurrence of a defect in a semiconductor device may be predicted in advance, so that an improvement process significantly reducing occurrence of defects due to exposure to radiation may be developed in advance and applied to a production line.

Figure 2:
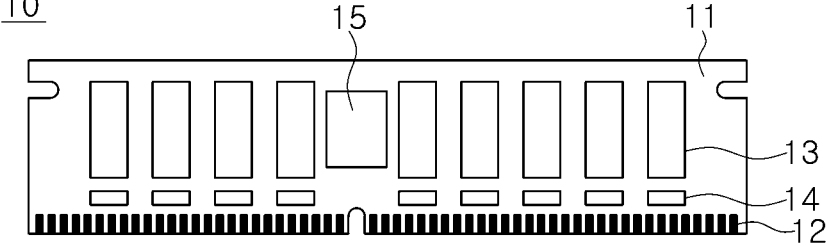
FIGS. 2 and 3 are diagrams illustrating a semiconductor device according to an example embodiment of the present disclosure.
Figure 3:
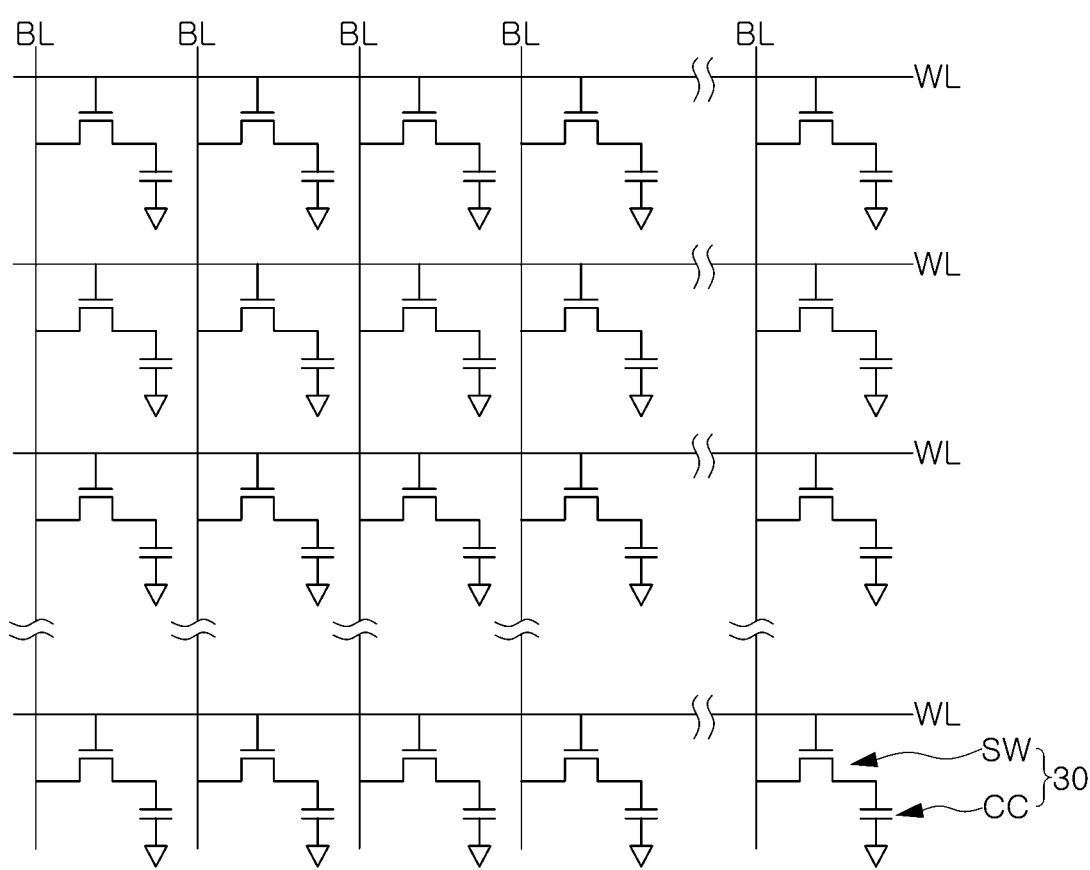

FIGS. 2 and 3 are diagrams illustrating a semiconductor device according to an example embodiment of the present disclosure.

Referring to FIG. 2, a semiconductor device 10 according to an example embodiment may be a memory module including dynamic random access memory (DRAM) chips. In the example embodiment illustrated in FIG. 2, the semiconductor device 10 is illustrated as being a dual in-line memory module (DIMM). However, the semiconductor device 10 may be a memory module in which DRAM chips are vertically stacked. The semiconductor device 10 may include a module substrate 11, memory chips 13, buffer chips 14, a register clock driver 15, and/or other components. A connector 12 having a plurality of pins may be formed on one side of the module substrate 11, and the semiconductor device 10 may be coupled to a mainboard through the connector 12.

The memory chips 13, the buffer chips 14, the register clock driver 15, and the like, may all be semiconductor chips produced by performing a semiconductor process on a semiconductor substrate including a semiconductor material. As described above, neutrons may be generated due to radiation exposure during transportation of the semiconductor device 10. Boron-10, or the like, may absorb neutrons, so that particles may be generated to cause defects such as, for example, a vacancy defect.

FIG. 3 is a schematic circuit diagram illustrating an example of a memory bank 20 included in the memory chips 13 in the semiconductor device 10 of FIG. 2. In an example embodiment, each of the memory chips 13 may include a plurality of memory banks 20, and the memory bank 20 may include a plurality of memory cells 30 connected to a wordline WL and a bitline BL.

The memory cell 30 may include a switch element SW and a capacitor CC. The switch element SW may be implemented as a transistor, a gate of the transistor may be connected to the wordline WL, and source/drain of the transistor may be connected to the bitline BL and the capacitor CC.

As an example, a defect caused by radiation may occur in the memory cell 30 during air transportation of the semiconductor device 10. A vacancy defect, or the like, may occur while particles generated by radiation move within the memory cell 30. Accordingly, electrical characteristics (for example, resistance) of the memory cell 30 may be changed.

A defect prediction model according to an example embodiment may predict a change in electrical characteristics of the memory cell 30 caused by radiation. Under the condition of the absence of radiation, the electrical characteristics of the memory cell 30 are predicted using the defect prediction model to obtain reference data. Under the condition of the presence of radiation, the electrical characteristics of the memory cell 30 are predicted using the defect prediction model to obtain prediction data. The reference data and the predicted data may be compared with each other to calculate an element defect probability of the memory cell 30 under the condition of presence of radiation, and a device defect probability of the semiconductor device 10 may be calculated from the calculation of the element defect probability. Reliability of processes of designing and producing the semiconductor device 10 may be tested using the device defect probability, and an effect thereof may be rapidly verified by developing, for example, an improvement process, or the like.

Figure 4:
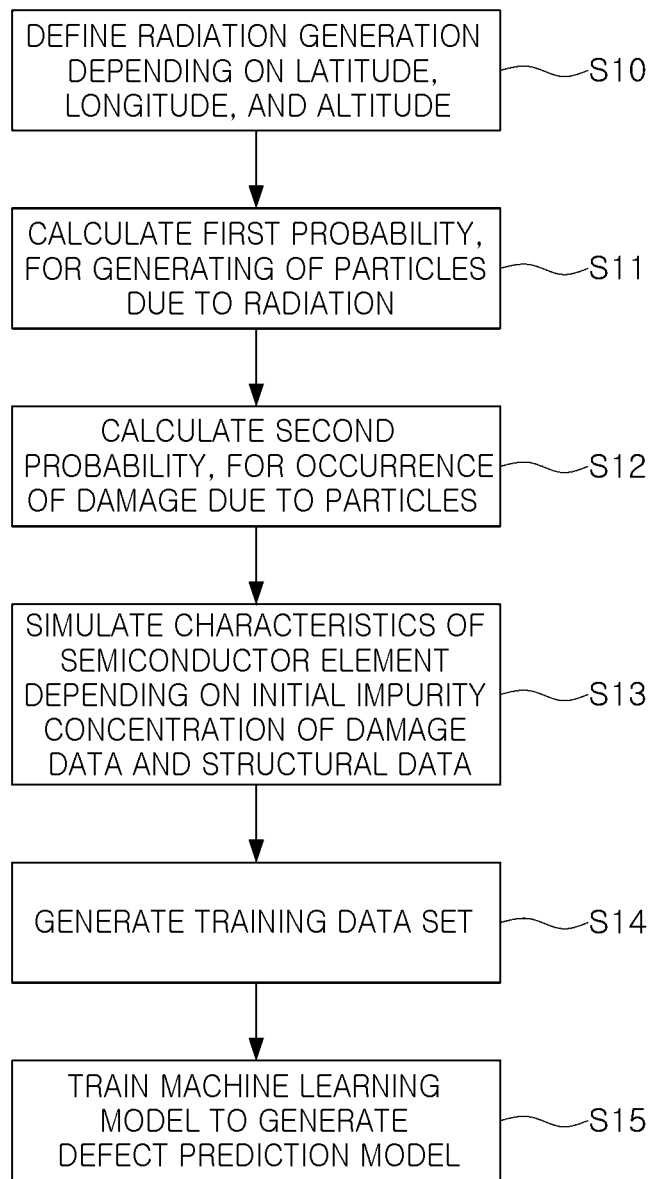
FIG. 4 is a flowchart illustrating a method for generating a defect prediction model according to an example embodiment of the present disclosure.

FIG. 4 is a flowchart illustrating a method for generating a defect prediction model according to an example embodiment of the present disclosure.

Referring to FIG. 4, a method for generating a defect prediction model according to an example embodiment may start with an operation of defining a radiation generation form depending on latitude, longitude, altitude, and the like (S10). For example, in operation S10, a pattern of cosmic radiation passing through the earth's magnetic field and reaching the atmosphere may be defined. The radiation generation form may be defined based on a dosage rate of cosmic radiation depending on latitude and longitude at a general cruising altitude of an aircraft, for example, about 10 kilometers.

Next, a first probability, a probability of generation of particles due to radiation, may be calculated (S11). Neutrons, protons, electron beams, and the like, may be generated at a height corresponding to the general cruising altitude of the aircraft. In particular, a material present in a semiconductor device may absorb neutrons, or the like, to generate particles. As an example, the material present in the semiconductor device may absorb thermal neutrons to generate particles.

In an example embodiment, the first probability may be calculated by a simulation tool using a radiation particle transport code. As an example, the simulation tool may predict the number of thermal neutrons generated by radiation. After determining a configuration of a semiconductor element and designating the amount of materials absorbing thermal neutrons, or the like, included in the semiconductor element, a situation of the case in which neutrons are incident may be simulated using a simulation tool. A case in which neutrons are incident from above or all directions of the semiconductor element may be simulated using the simulation tool, and the semiconductor element may be a memory cell.

When the simulation is completed, a position and the number of times a nuclear fission reaction has occurred due to absorption of the neutrons, or the like, by the materials included in the semiconductor element may be output as a simulation result. According to some embodiments, particles or the like, which may cause damage to a semiconductor device, may be generated due to the nuclear fission reaction. The first probability may be calculated through the simulation from the number of neutrons incident on the semiconductor element and the number of particles generated by the nuclear fission reaction. As an example, the first probability may be determined by the number of particles compared with the number of neutrons.

A second probability, a probability of occurrence of damage due to the particles, may be calculated (S12). The second probability is conceptually different from the first probability, a probability of the generation of the particles, and may be calculated in consideration of the fact that all particles do not cause damage to the semiconductor device. In an example embodiment, the second probability may be calculated by a Monte Carlo simulation.

As an example, in a process of calculating the second probability, a probability of occurrence of damage depending on a position of a semiconductor element included in the semiconductor device may be calculated. The particles, generated by the nuclear fission reaction, may cause a vacancy defect in a semiconductor material such as silicon, or the like. As a result, characteristics of the semiconductor element may be changed and reliability thereof may be deteriorated. Accordingly, the probability of the occurrence of damage may appear to be in proportion to the amount of the semiconductor material depending on the position of the semiconductor element.

When the first probability and the second probability are calculated, the characteristics of the semiconductor element may be simulated using damage data, an initial impurity concentration, and/or a structural parameter depending on a process distribution (S13). Though operation S13 describes damage data, an initial impurity concentration, and/or a structural parameter as potential simulation inputs, the embodiments of the present disclosure are not limited thereto, and other input data may also be used without deviating from the embodiments of the present disclosure. As used herein, the term "and/or" includes any and all combinations of one or more of the associated listed items. As an example, technology computer aided design (TCAD) may be used in the simulation of operation S13. For example, a simulation tool may be set up in advance to output the characteristics (for example, resistance, and the like) of the semiconductor element of the semiconductor element, using TCAD, and then the damage data, the initial impurity concentration, and/or the structural parameters, may be input to the simulation tool to obtain the characteristics of the semiconductor element output by the simulation tool. The damage data may include a type of damage appearing in a semiconductor element, a damage occurrence position, a ratio of the number of incidents of damage depending on the damage occurrence position, and the like. The initial impurity concentration may be a concentration of impurities doped into a semiconductor material in a process. In an example embodiment, the initial impurity concentration may include a concentration of phosphorus, an N-type impurity. In an example embodiment, the structural parameters may include information regarding the physical structure of the semiconductor element, such as a layout of the device, dimensions of portions of the device, and/or materials included in the device.

A training data set may be generated using a result of the simulation performed in operation S13 (S14). The training data set may include input data and simulation data used as a reference for performing training. The input data may include a damage generation location, a type of damage, an initial impurity concentration, and/or a structural parameter input to the simulation tool in operation S13. The simulation data may include characteristics (for example, resistance, and the like) of the semiconductor element output from the simulation tool in operation S13.

The training data set may be used to train a machine learning model to generate a defect prediction model (S15). For example, input data may be input to an input layer of a machine learning model, and output data output from the machine learning model may be compared with simulation data of the training data set. The output data and the simulation data can be compared by a predetermined loss function. The machine learning model may perform training based on a result of comparing the output data with the simulation data, and the training-completed machine learning model may be provided as a defect prediction model. In some embodiments, the defect prediction model may be used to manufacture improved semiconductor devices. For example, the defect prediction model may be applied to a proposed design of a semiconductor device to predict defects in the proposed design due to damage from radiation. Based on an output of the defect prediction model as applied to the proposed design of the semiconductor device, an improved semiconductor design may be obtained. For example, the proposed design may be incrementally altered to generate an updated design based on output from the defect prediction model. The updated semiconductor design may be utilized to manufacture a semiconductor device that is technologically improved from its predecessor in that it has improved resistance to radiation damage.

Hereinafter, a method of generating a defect prediction model will be described in more detail with reference to various embodiments of the present disclosure.

Figure 5:
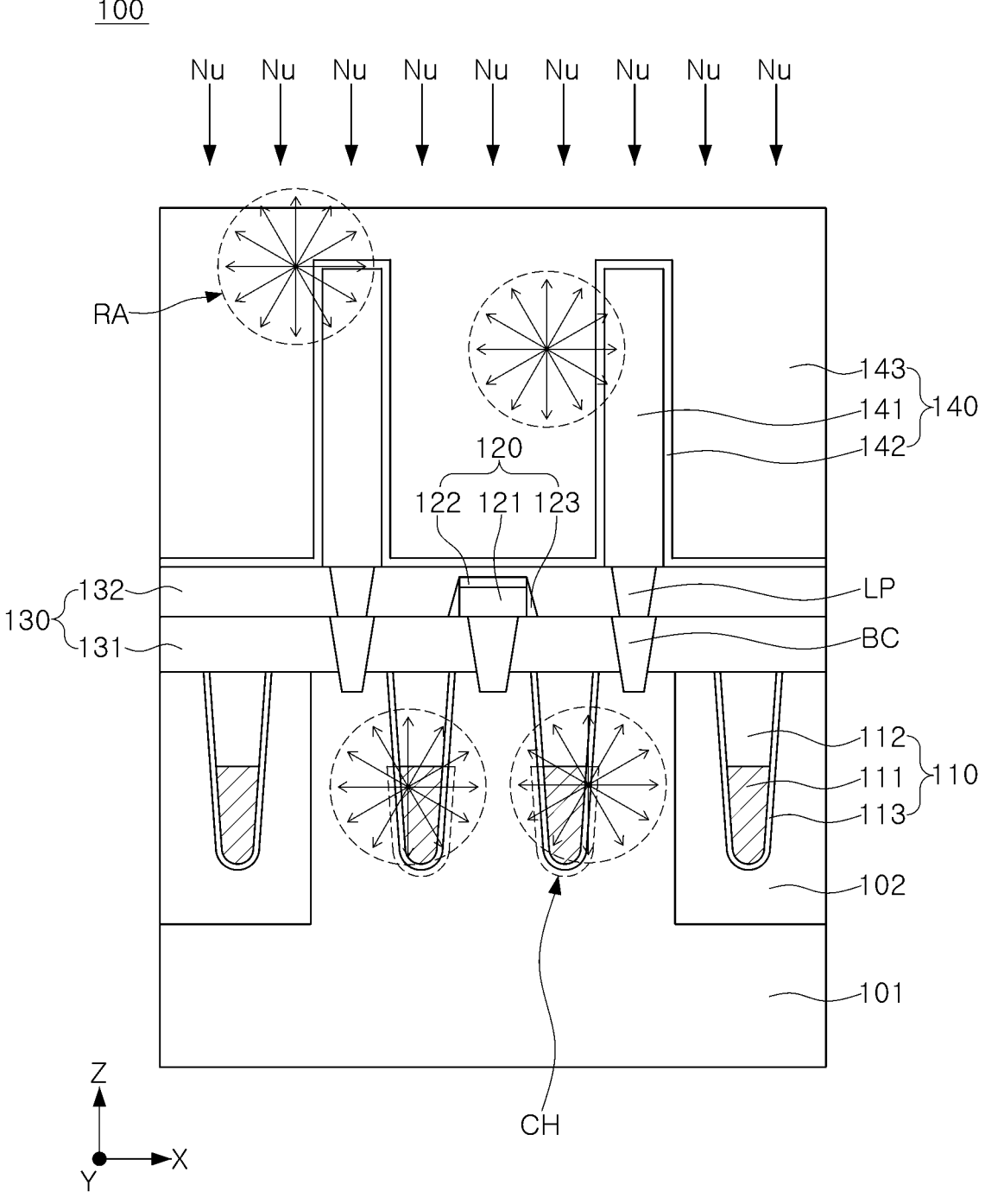
FIG. 5 is a schematic diagram of a semiconductor device according to an example embodiment of the present disclosure.

FIG. 5 is a schematic diagram of a semiconductor device according to an example embodiment of the present disclosure.

In an example embodiment illustrated in FIG. 5, a semiconductor device may be a dynamic random-access memory (DRAM). FIG. 5 is a cross-sectional view of an example semiconductor element included in a semiconductor device. For example, the semiconductor element may be a memory cell including a transistor and a capacitor. The elements illustrated in FIG. 5 are merely examples and are not intended to limit the scope of the present disclosure. In some embodiments, more or fewer components, or different types of components, may be included without deviating from the present disclosure.

Referring to FIG. 5, a semiconductor device 100 may include a substrate 101 including a semiconductor material, a gate structure 110, a bitline structure 120, an interlayer insulating layer 130, and a capacitor 140. In the substrate 101, an isolation region 102 may be formed to define an active region. The isolation region 102 may be formed of an insulating material. The gate structure 110 may be formed in a structure buried in the substrate 101.

The gate structure 110 may include a gate electrode 111, a capping layer 112, a gate insulating layer 113, and the like. According to embodiments, the gate electrode 111 may have a multilayer structure formed of a plurality of different conductive materials, for example, metal materials, and may provide a wordline. The capping layer 112 may be formed of polysilicon, silicon nitride, silicon oxide, silicon oxynitride, silicon carbonitride, silicon oxycarbonitride, or the like. The gate insulating layer 113 may be formed of a high-k dielectric material having a higher dielectric constant than silicon oxide, silicon nitride, or the like. As illustrated in FIG. 5, a channel region CH may be formed around the gate electrode 111.

The interlayer insulating layer 130 may be disposed on the substrate 101. The interlayer insulating layer 130 may include a lower interlayer insulating layer 131 and an upper interlayer insulating layer 132. An active region adjacent to the gate structure 110 may be connected to a buried contact BC penetrating through the lower interlayer insulating layer 131, and the buried contact BC may be connected to a landing pad LP penetrating through the upper interlayer insulating layer 132. The buried contact BC, connected to the active region between adjacent gate structures 110, may be connected to the bitline structure 120. The bitline structure 120 may include a conductive layer 121, a capping layer 122, a spacer 123, and the like.

A capacitor 140, extending in a first direction (e.g., a Z-axis direction), may be connected to an upper portion of the landing pad LP. The capacitor 140 may include a lower electrode 141, a capacitor dielectric layer 142, and an upper electrode 143. The lower electrode 141 may have a shape, other than a pillar shape as illustrate in FIG. 5. The lower electrode 141 may be formed of a metal or a metal compound, and the upper electrode may be formed of a doped semiconductor material, for example, silicon-germanium (SiGe).

Radiation may be present around the semiconductor device 100 during transportation of the semiconductor device 100, and thus, neutrons Nu may be incident on the semiconductor device 100. The neutrons Nu, incident on the semiconductor device 100, may be absorbed by a material having a high neutron absorption rate, for example, boron-10, among materials included in the semiconductor device 100, to cause a nuclear fission reaction RA. As an example, as illustrated in FIG. 5, a nuclear fission reaction RA may occur in silicon-germanium forming the upper electrode 143 of the capacitor 140, so that predetermined particles may be generated. In addition, the nuclear fission reaction RA may occur in the substrate 101 including the semiconductor material, and particles may be generated as a result of the nuclear fission reaction RA.

During movement of the particles generated by the nuclear fission reaction RA, damage may occur due to collision with a nucleus of a semiconductor material such as silicon or silicon-germanium. A probability of occurrence of damage due to the particles may vary depending on incident energy and an angle of incidence of the particles.

Hereinafter, this will be described in more detail with reference to FIG. 6.

Figure 6:
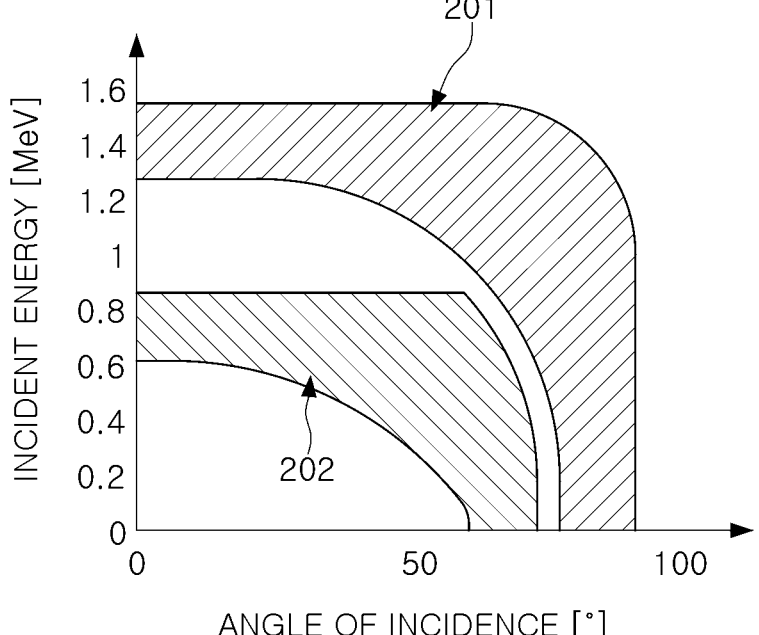
FIG. 6 is a diagram illustrating an angle of incidence and incident energy of particles in a semiconductor device according to an example embodiment of the present disclosure.

FIG. 6 is a diagram illustrating an angle of incidence and incident energy of particles in a semiconductor device according to an example embodiment of the present disclosure.

As an example, different types of particles may be simultaneously generated by a nuclear fission reaction RA, and incident energy of the particles may vary depending on the type of particles. As an example, when each of a first particle and a second particle collides with a nucleus of silicon, incident energies may be different from each other, and the second particle may have relatively higher incident energy than the first particle.

A graph of FIG. 6 is a graph illustrating incident energy and angle of incidence of examples of a first particle 201 and a second particle 202 incident on a buried contact. Referring to FIG. 6, the incident energy of the first particle 201 and the second particle 202 may have a maximum value when the angle of incidence is zero degrees. In other words, when the first particle 201 and the second particle 202 are incident in a direction perpendicular to an upper surface of a substrate included in the semiconductor device, the first and second particles 201 and 202 may have highest incident energy. As the angle of incidence is increased, the incident energies of the first and second particles 201 and 202 may be decreased. The angle of incidence may be an angle between a direction, in which the first particle 201 and the second particle 202 move, and the direction perpendicular to the upper surface of the substrate.

A moving displacement of particles generated by a nuclear fission reaction may be greater than a size of a single memory cell included in the semiconductor device described with reference to FIG. 5. Not all of the particles generated by a nuclear fission reaction may cause damage. Therefore, a nuclear fission reaction caused by neutrons introduced into the semiconductor device and the number of particles generated by the nuclear fission reaction may be obtained using a simulation tool, and then a probability of occurrence of damage due to the particles may be calculated using a separate simulation tool. Hereinafter, this will be described with reference to FIGS. 7 to 11.

FIGS. 7 to 9 are diagrams illustrating a method for calculating a damage occurrence probability in a semiconductor device according to an example embodiment of the present disclosure.

FIG. 7 is a table illustrating the number of particles generated in an example memory cell according to an example production process of a semiconductor device. Referring to FIG. 7, in the case of a semiconductor device produced by a first process, 74 first particles and 87 second particles are generated in a first region of a memory cell by a nuclear fission reaction, and nine first particles and nine second particles may be generated in a second region different from the first region. The nuclear fission reaction may be a reaction performed by radiation affecting a semiconductor device during air transportation of the semiconductor device.

In the semiconductor device produced by a second process, a smaller number of first particles and second particles may be generated in the first region of the memory cell, as compared with the semiconductor device produced by the first process. In a semiconductor device produced by a third process, a smaller number of first particles and second particles may be generated in the second region of the memory cell, as compared with the semiconductor device produced by the first process. As an example, the second process may be an example embodiment in which an additional process for suppressing a nuclear fission reaction in the first region of the memory cell is applied, as compared with the first process. The third process may be an example embodiment in which an additional process for suppressing a nuclear fission reaction in the second region of the memory cell is applied, as compared with the first process.

FIG. 8 is a graph illustrating an example of a damage occurrence probability predicted using a predetermined simulation tool. As an example, the damage occurrence probability may be calculated from a simulation tool measuring displacement damage. The displacement damage may be damage occurring when atoms of silicon and/or doped impurities, included in a semiconductor material, are separated from a crystal lattice by first particles and/or second particles. In an example embodiment, a probability of occurrence of damage due to displacement damage may be illustrated in FIG. 8.

Referring to FIG. 8, a probability that damage will occur in a first region due to first particles in a semiconductor device produced in a second process may be lower than a probability that damage will occur in a first region due to first particles in a semiconductor device produced in a first process. On the other hand, a probability that damage will occur in a first region due to second particles in the semiconductor device produced in the second process may be higher than a probability that damage will occur due to second particles in a first region in the semiconductor device produced in the first process.

In the case of the third process, there may be no difference between damage occurrence probabilities predicted in a first region, as compared with the first process. In the case of the semiconductor device to which the third process is applied as in the embodiment described above with reference to FIG. 7, first and second particles may not be present in a second region. Accordingly, in the semiconductor device produced by the third process, a probability that damage will occur in the second region due to first particles and second particles may be zero. A probability that damage will occur in the first region by the third process may be the same as a probability obtained as a result of the simulation in the semiconductor device produced by the first process.

FIG. 9 is a graph illustrating a result of an example simulation for the amount of damage occurring in each of an upper electrode and a gate structure included in an example semiconductor element. The amount of damage according to the example embodiment illustrated in FIG. 9 may be calculated as a product of the number of particles described with reference to FIG. 7 and the damage occurrence probability described with reference to FIG. 8. Referring to FIG. 9, the amount of damage occurring in a semiconductor element included in the semiconductor device produced by each of the second and third processes may be smaller than the amount of damage occurring in the semiconductor element included in the semiconductor device produced by the first process.

Figure 10:
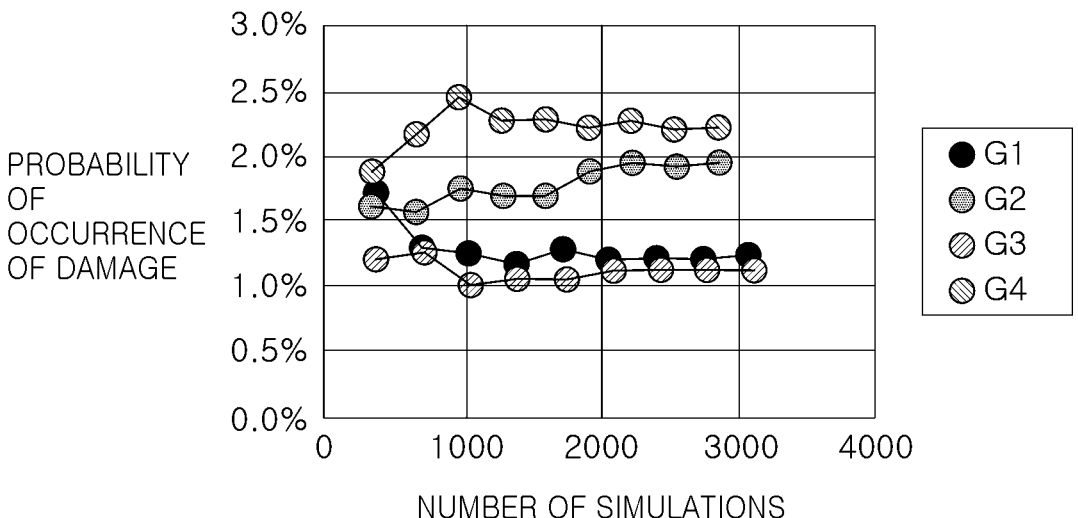
FIGS. 10 and 11 are graphs illustrating damage occurrence probabilities depending on positions of a semiconductor device according to an example embodiment of the present disclosure.
Figure 11:
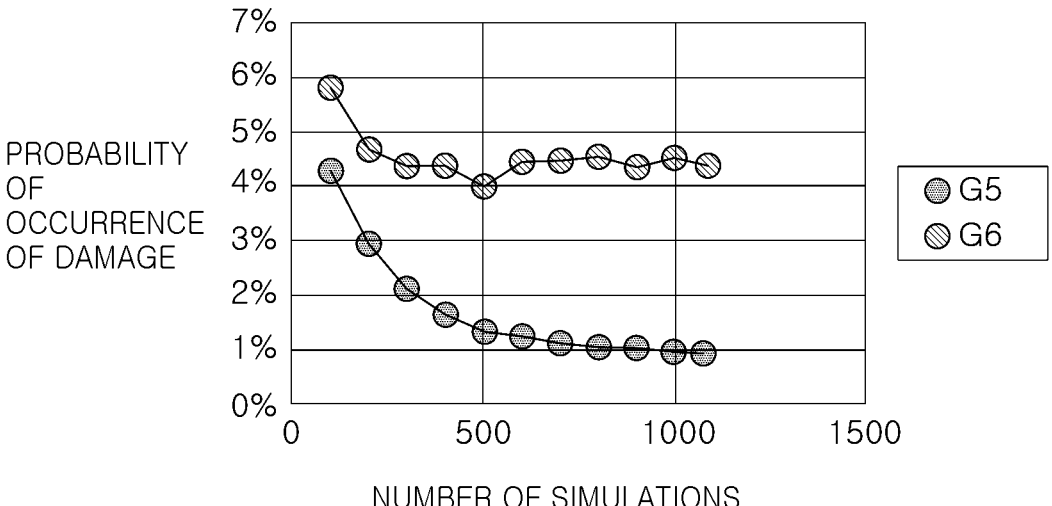

FIGS. 10 and 11 are graphs illustrating damage occurrence probabilities depending on positions of a semiconductor device according to an example embodiment of the present disclosure.

FIGS. 10 and 11 are graphs respectively illustrating a result of simulating damage occurrence probabilities in different positions of an example semiconductor device using a simulation tool for predicting displacement damage. FIG. 10 is a graph illustrating a damage occurrence probability in a first region of an example memory cell included in a semiconductor element, and FIG. 11 is a graph illustrating a damage occurrence probability in a second region of an example memory cell included in a semiconductor element. The first region and the second region may be regions defined by different positions within the example memory cell. In an example embodiment, a damage occurrence probability obtained as a result of a simulation may vary depending on the type of particle and a production process of a semiconductor device including a semiconductor element.

In FIG. 10, graphs G1 to G4 represent damage occurrence probabilities in the first region of the example semiconductor devices produced by the first and second processes described with reference to FIGS. 7 to 9. The second process may further include an additional process of decreasing a probability of generation of particles in the first region, in addition to the first process.

In the graphs of FIG. 10, the first graph G1 may represent a probability of occurrence of damage due to first particles in a first region of a semiconductor element included in a semiconductor device produced by a first process. The second graph G2 may represent a probability of occurrence of damage due to second particle in the first region of the semiconductor element included in the semiconductor device produced by the first process. The third graph G3 may represent a probability of occurrence of damage due to the first particle in a first region of a semiconductor element included in a semiconductor device produced by a second process. The fourth graph G4 may represent a probability of occurrence of damage due to second particle in the first region of the semiconductor element included in the semiconductor device produced by the second process.

Referring to FIG. 10, as the number of times of simulation is increased (the x-axis of FIG. 10), the damage occurrence probability represented by each of the first to fourth graphs G1 to G4 may converge to a predetermined predicted probability. Referring to the first graph G1, a probability of occurrence of damage in the first region due to the first particles in the semiconductor device produced by the first process may be predicted to be 1.23%. Similarly, referring to the second to fourth graphs G2 to G4, probabilities of occurrence of damage in the first region may be predicted to be 1.94%, 1.12%, and 2.22%, respectively. Therefore, the same result as described with reference to FIG. 8 may be obtained through the simulation.

In FIG. 11, graphs G5 to G6 may represent probabilities of occurrence of damage in a second region included in the semiconductor devices produced by the first process. In FIG. 11, a fifth graph G5 may represent a probability of occurrence of damage due to first particles in a gate structure of a semiconductor element included in an example semiconductor device. The sixth graph G6 may represent a probability of occurrence of damage due to second particle in the second region of the semiconductor element included in the example semiconductor device.

Similarly to the description provided with reference to FIG. 10, as the number of times of simulations is increased (the x-axis in FIG. 11), the damage occurrence probability represented by each of the fifth and sixth graphs G5 and G6 may converge to a predetermined prediction probability. Referring to the fifth graph G5, a probability of occurrence of damage in a second region due to first particles may be predicted to be 1.00%. Referring to the sixth graph G6, a probability of occurrence of damage in a second region due to second particles may be predicted to be 4.40%. Therefore, the same result as described above with reference to FIG. 8 may be obtained through a simulation.

The damage occurrence probabilities described with reference to FIGS. 10 and 11 may be calculated as a ratio of the number of first particles generated by a nuclear fission reaction, the number of incidents of damage occurring in a semiconductor element due to the first particles, and the number of second particles generated by the nuclear fission reaction. With a simulation performed only once and/or a simulation for a single semiconductor element, no damage may occur due to first particle and/or the second particle, or a significantly great amount of damage may occur.

In an example embodiment, the number of times of simulation and/or the number of semiconductor elements to be simulated may be increased to improve accuracy of the simulation. Therefore, as described with reference to FIGS. 11 and 12, a damage occurrence probability depending on a production process of a semiconductor device, the type of particles, a damage occurrence position, and the like, may converge to a specific value, and the same table as described with reference to FIG. 9 may be obtained therefrom. In addition, the number of first particles and the number of second particles, predicted to occur in a semiconductor element due to radiation, may be multiplied by the damage occurrence probabilities obtained according to the embodiment described with reference to FIGS. 10 and 11, to calculate the amount of damage predicted to occur in a single semiconductor element.

Figure 12:
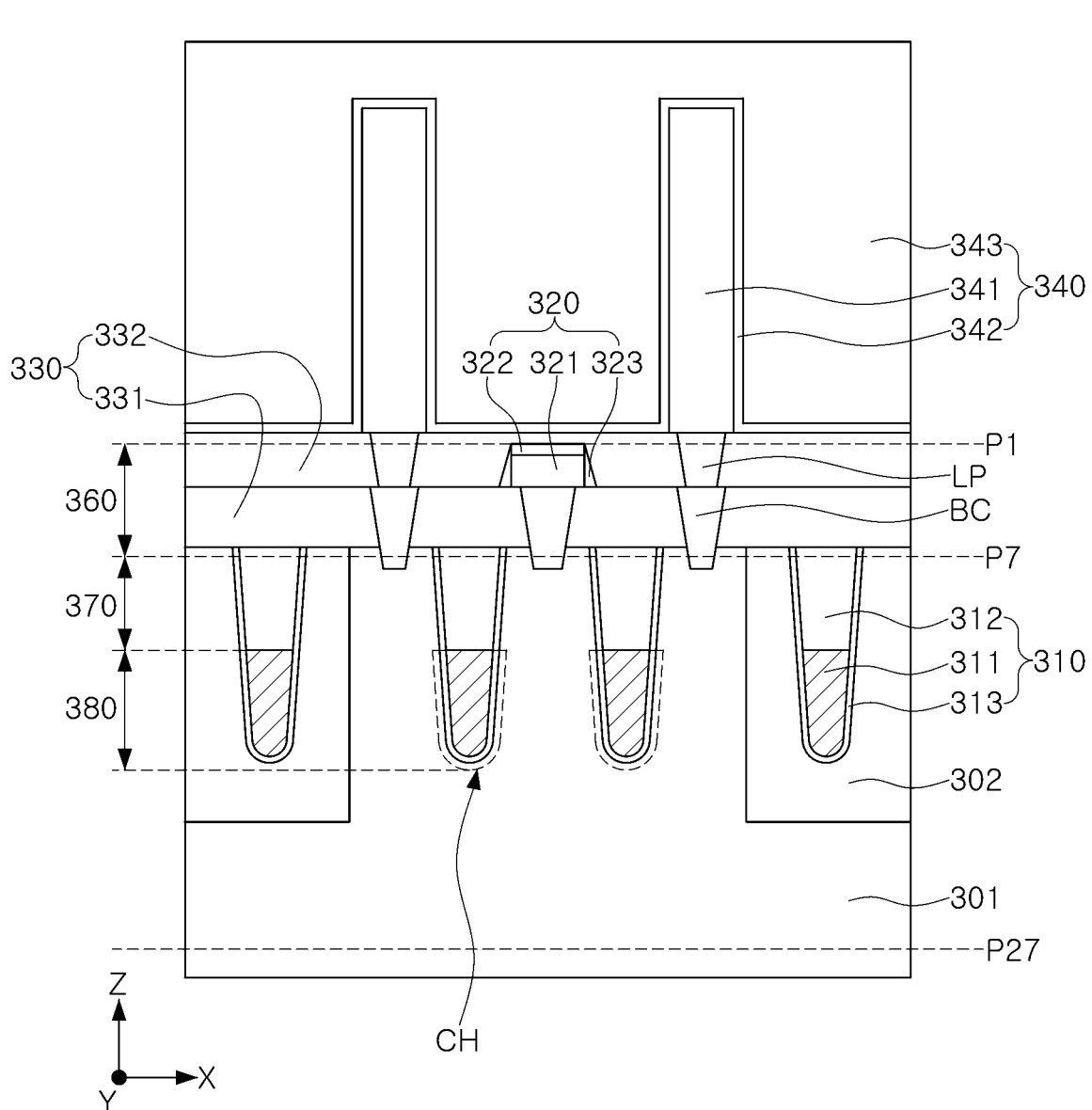
FIGS. 12 and 13 are diagrams illustrating damage occurrence ratios depending on positions of a semiconductor device according to an example embodiment of the present disclosure.
Figure 13:
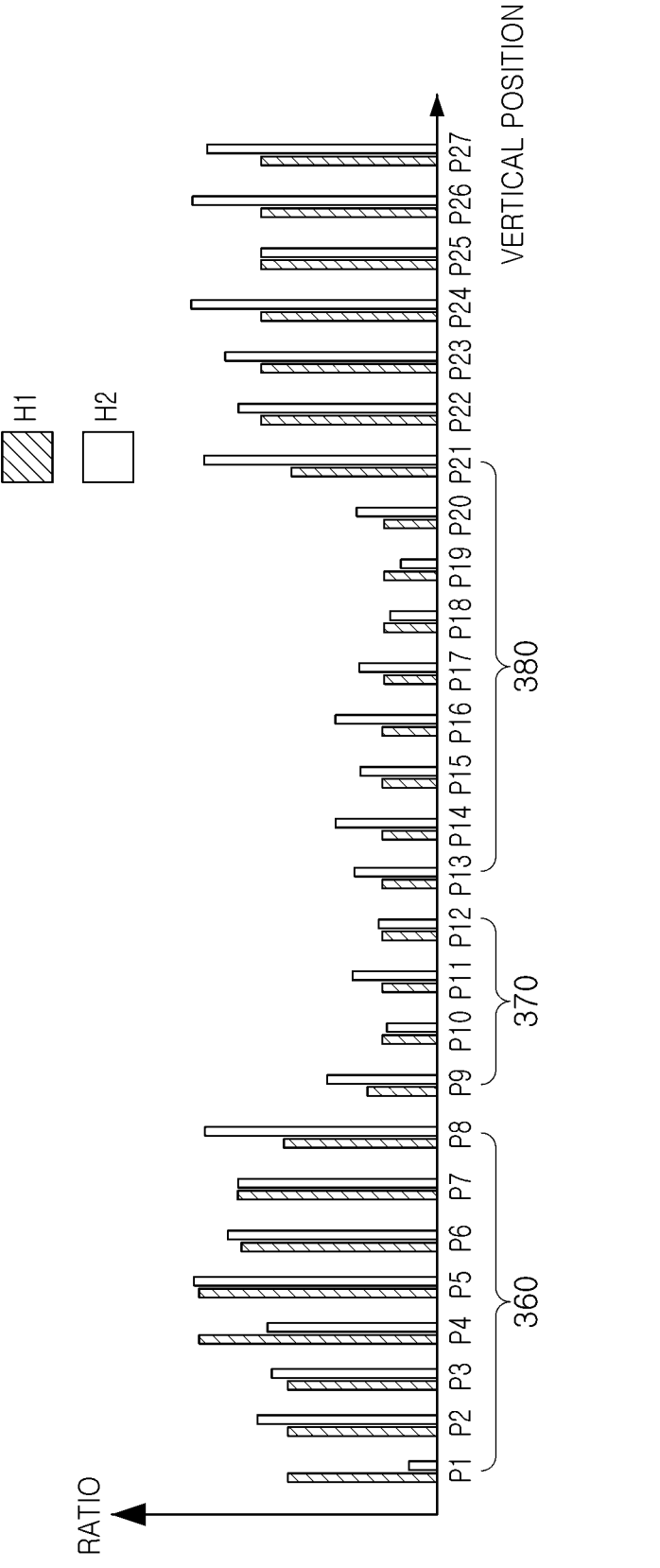

FIGS. 12 and 13 are diagrams illustrating damage occurrence ratios depending on positions of a semiconductor device according to an example embodiment of the present disclosure.

Referring to FIG. 12, a semiconductor device 300 may be a memory device having the same structure as the semiconductor device 100 described with reference to FIG. 5. The semiconductor device 300 may include a transistor, including a gate structure 310 and a channel region CH formed on the semiconductor substrate 301, a bitline structure 320, an interlayer insulating layer 330, a capacitor 340, an isolation region 302, and the like. The gate structure 310 may include a gate electrode 311, a capping layer 312, and a gate insulating layer 313. The interlayer insulating layer 330 may include a lower interlayer insulating layer 331 and an upper interlayer insulating layer 332. The bitline structure 320 may include a conductive layer 321, a capping layer 322, and a spacer 323. The capacitor 340 may include a lower electrode 341, a capacitor dielectric layer 342, and an upper electrode 343. A semiconductor element included in the semiconductor device 300 may be a memory cell, and the semiconductor element may include a transistor and a capacitor.

Referring to FIGS. 12 and 13, in an example embodiment, a damage occurrence rate depending on a plurality of positions P1 to P27 defined in a semiconductor element may be predicted. The plurality of positions P1 to P27 defined in the semiconductor element may be defined in a first direction (e.g., a Z-axis direction), and may be defined above and below a seventh position P7 corresponding to an upper portion of an active region formed in the substrate 301. In FIG. 12, only some of the positions of P1 to P27 are illustrated for ease of illustration.

In an example embodiment, damages occurring due to particles may not uniformly appear in the plurality of positions P1 to P27 defined in the semiconductor element and, as an example, may have a distribution illustrated in FIG. 13. In FIG. 13, a first histogram H1 may represent the amount of silicon, a semiconductor material, in each of the plurality of positions P1 to P27, and a second histogram H2 may represent a ratio of the number of incidents of damage obtained by a simulation result in each of the plurality of positions P1 to P27.

Referring to FIG. 13, in each of the plurality of positions P1 to P27, the amount of silicon and a ratio of the amount of damage may be in proportion to each other. In other words, when the amount of silicon is increased, the ratio of the number of incidents of damage may tend to be increased. Meanwhile, when the amount of silicon is decreased, the ratio of the number of incidents of damage may tend to be decreased. This may be because damage occurs due to collision with atoms such as silicon, or the like, while particles generated by neutrons are moved.

In FIG. 12, the semiconductor element may include three regions. The first region 360 may be a region including a buried contact BC and a landing pad LP, and a second region 370 may be a region between the buried contact BC and a channel region CH. A third region 380 may be a region including the channel region CH and a gate electrode 311 of the gate structure 310. Damages affecting an operation of the semiconductor device may mainly occur in the first to third regions 360 to 380.

Returning to FIG. 13, damage affecting the operation of the semiconductor device may occur at a rate of about 50% in the first region 360, at a rate of about 20% in the second region 370, and at a rate of about 30% in the third region 380. The number of incidents of damage appearing in the second region 370 may be relatively small due to the gate structures 310 disposed at a high density.

The ratio of the number of incidents of damage depending on the plurality of positions P1 to P27, defined in the semiconductor element described with reference to FIGS. 12 and 13, may be used to generate a training data set for training a machine learning model to generate a defect prediction model. As an example, the plurality of positions P1 to P27 defined in the semiconductor element, the number of incidents of damage occurring in each of the plurality of positions P1 to P27, and the like, may be input to a technology computer aided design (TCAD) simulation tool. The TCAD simulation tool may output electrical characteristics of the semiconductor element, based on the received data. A training data set, including the data input to the TCAD simulation tool and data output by the TCAD simulation tool, may be configured.

Figure 14:
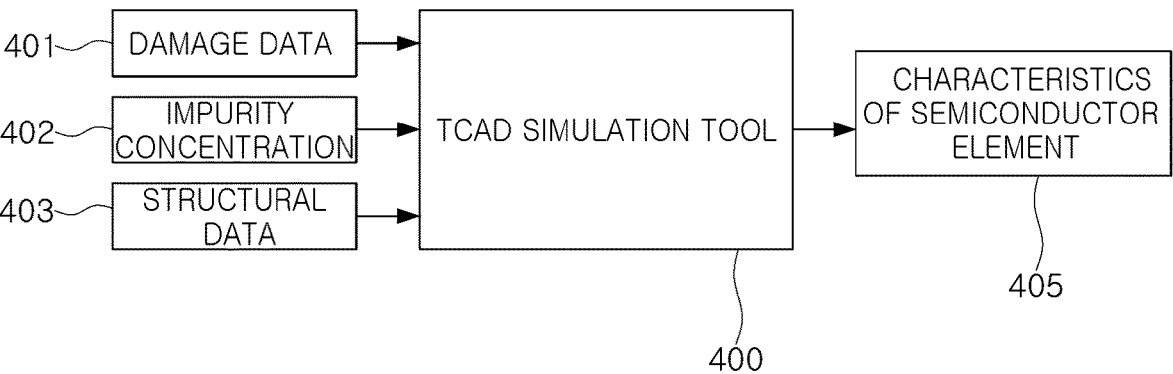
FIG. 14 is a diagram illustrating a method for generating a training data set of a machine learning model according to an example embodiment of the present disclosure.

FIG. 14 is a diagram illustrating a method for generating a training data set of a machine learning model according to an example embodiment of the present disclosure.

Referring to FIG. 14, in an example embodiment, a training data set utilized to train a machine learning model may be generated using a TCAD simulation tool 400.

The TCAD simulation tool 400 may be a simulation tool set up to output electrical characteristics of a semiconductor element, based on predetermined input data. As an example, the TCAD simulation tool 400 may be set up to output electrical characteristics of a semiconductor element included in a semiconductor device transported in a radiation-rich environment. In an example embodiment, when the semiconductor device is a DRAM device, the TCAD simulation tool 400 may be set up to output electrical characteristics of a single memory cell. However, this is only an example embodiment, and the TCAD simulation tool 400 may be set up to output electrical characteristics of a plurality of memory cells.

Input data 401, 402, 403 (referred to generally herein as "401 to 403"), input to the TCAD simulation tool 400, may include damage data 401, a concentration of impurities included in a semiconductor element 402, structural data 403 reflecting a process distribution, or the like, formed in a production process of the semiconductor element. For example, the damage data may include a plurality of positions defined in the semiconductor element, a ratio of the number of incidents of damage occurring in each of the plurality of positions, the type of damage occurring in the semiconductor element, and the like.

As an example, the type of damage may include a vacancy defect occurring in a semiconductor material, a vacancy defect occurring in impurities doped with a semiconductor material, or the like. The plurality of positions may be defined in a vertical direction of the semiconductor element, as described above with reference to FIGS. 12 and 13, and may include a ratio of the number of incidents of damage to be predicted to occur in each of the plurality of positions. A method for predicting the number of incidents of damage occurring in each of the plurality of positions may be understood with reference to the example embodiments described with reference to FIGS. 5 to 13.

The TCAD simulation tool 400, receiving input data 401 to 403, may output characteristics 405 of the semiconductor element. In an example embodiment illustrated in FIG. 14, the TCAD simulation tool 400 may output a resistance, an electrical characteristic of the semiconductor element. As described above, the semiconductor element may be a memory cell. The resistance, output by the TCAD simulation tool 400, may be resistance under the assumption of a state in which ON-current flows through a transistor included in a memory cell.

The characteristic 405 of the semiconductor device, output by the predetermined TCAD simulation tool 400, may vary depending on the input data 401 to 403 input to the TCAD simulation tool 400. As an example, when a damage occurrence position and the number of incidents of position-dependent damage are increased, resistance of the memory cell output by the TCAD simulation tool 400 may be increased. In some embodiments, a damage occurrence position and a ratio of the number of incidents of position-dependent damage may be changed to increase or decrease the resistance of a memory cell output by the TCAD simulation tool 400. When a threshold dimension of a buried contact included in the structural data 403 is increased, the resistance of the memory cell output by the TCAD simulation tool 400 may be decreased. Accordingly, the input data 401 to 403 may be changed in various ways and may be input to the TCAD simulation tool 400, and the characteristics 405 of the semiconductor element may be obtained, and thus, a training data set including the input data 401 to 403 and the characteristics 405 of the semiconductor element may be configured.

Figure 15:
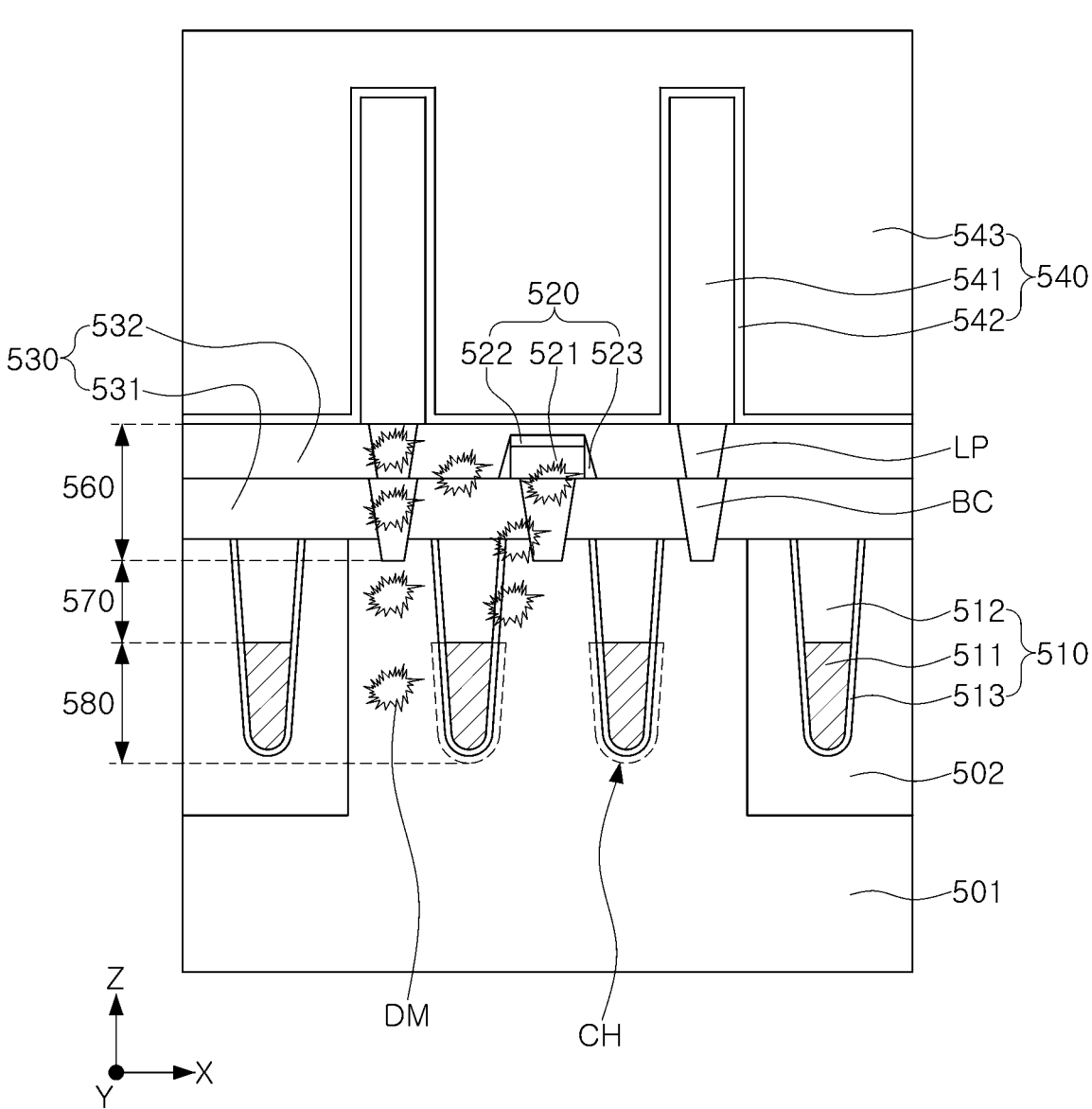
FIGS. 15 to 17 are diagrams illustrating a method for generating a training data set of a machine learning model according to an example embodiment of the present disclosure.
Figure 16:
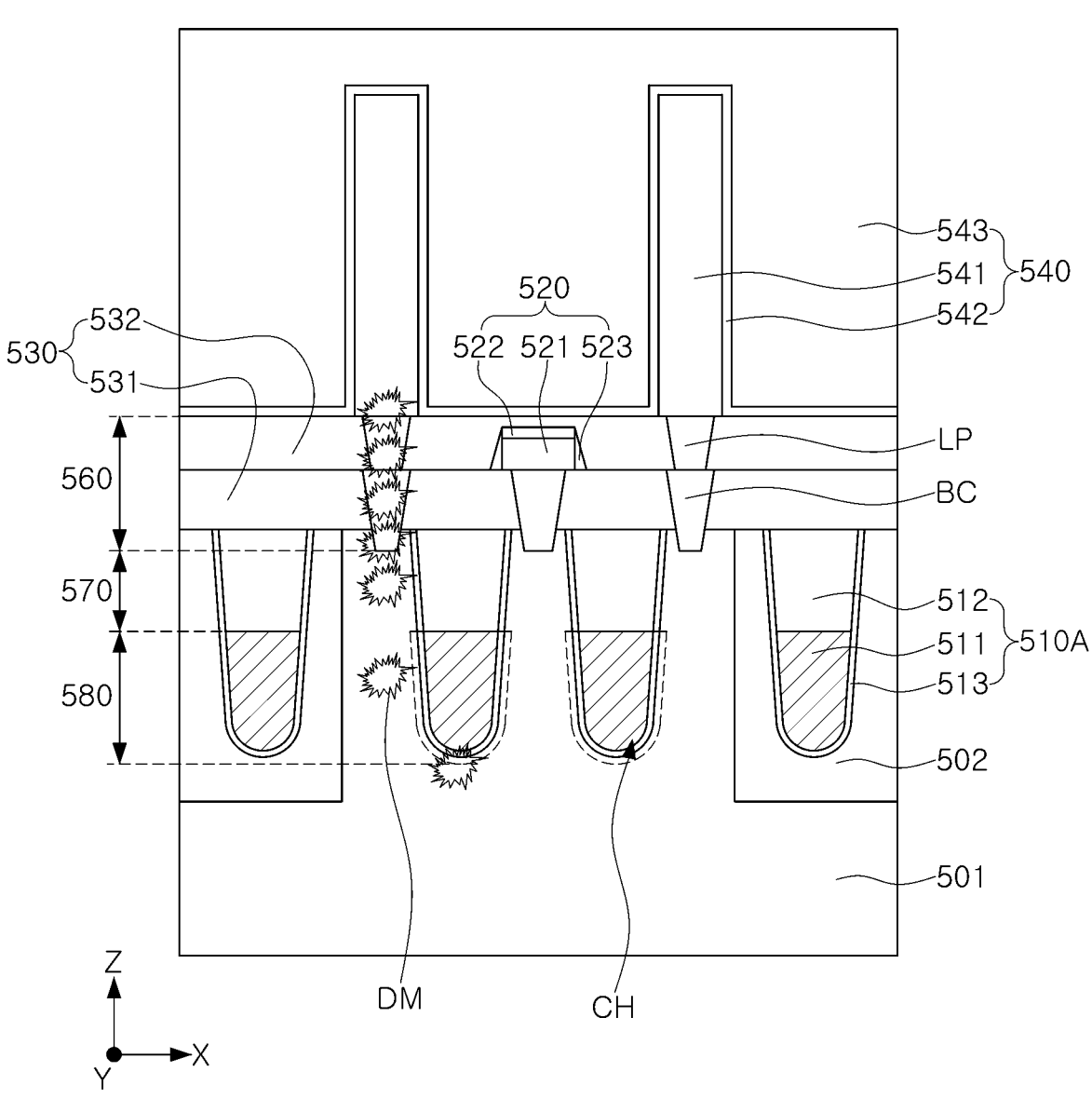
Figure 17:
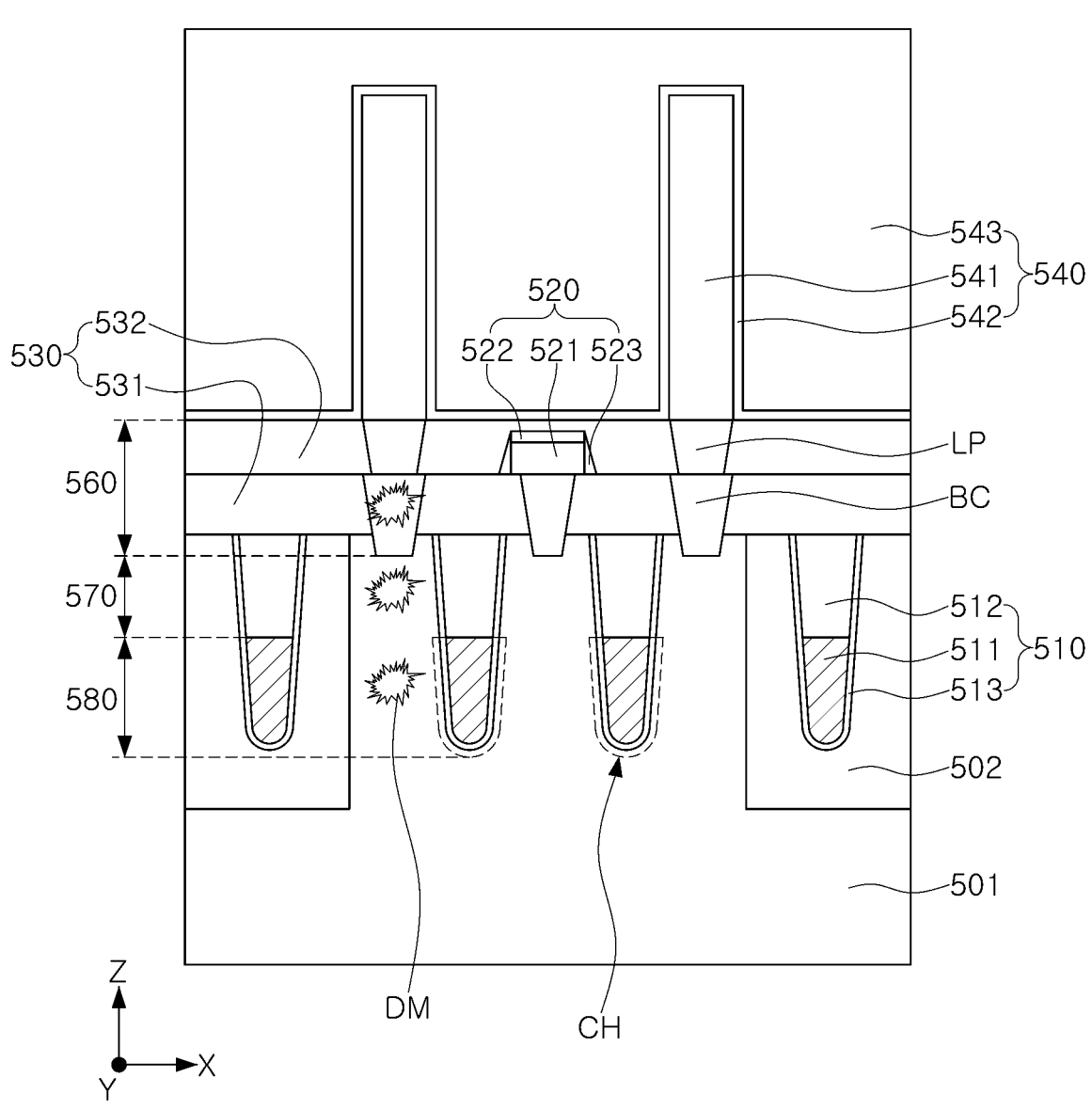

FIGS. 15 to 17 are diagrams illustrating a method for generating a training data set of a machine learning model according to an example embodiment of the present disclosure.

To generate a training data set for training a machine learning model according to an example embodiment, input data of various conditions may be input to a TCAD simulation tool as illustrated in FIGS. 15 to 17. Referring to FIGS. 15 to 17, a semiconductor device 500 for predicting a defect with a defect prediction model generated by training a machine learning model may be a DRAM device.

A structure of the semiconductor device 500 may be similar to the above-described structures of the semiconductor devices 100, 300. The semiconductor device 500 may include a substrate 501 having an isolation region 502 for defining an active region, a gate structure 510 providing a wordline and buried in the substrate 501, a bitline structure 520, an interlayer insulating layer 530, a capacitor 540, and the like. The gate structure 510 may include a gate electrode 511, a capping layer 512, and a gate insulating layer 513. The interlayer insulating layer 530 may include a lower interlayer insulating layer 531 and an upper interlayer insulating layer 532. The bitline structure 520 may include a conductive layer 521, a capping layer 522, and a spacer 523. The capacitor 540 may include a lower electrode 541, a capacitor dielectric layer 542, and an upper electrode 543. A source/drain region, provided by an active region adjacent to the gate structure 510, may be connected to a buried contact BC, and a portion of the buried contact BC may be connected to the capacitor 540 through a landing pad LP.

Referring to FIG. 15, damage DM may occur in a first region 560 around (e.g., in proximity to) and/or adjacent the buried contact BC and the landing pad LP, a second region 570 between the buried contact BC and the channel region CH, and a third region 580 around and/or adjacent the channel region CH and the gate structure 510. As an example, damage DM may cause an interface trap, formed in an interface between structures formed of different materials, or the like, and may deteriorate electrical characteristics of a semiconductor element.

In an example embodiment, structural data defining a semiconductor element, a concentration of impurities included in the semiconductor element, and damage data representing damage DM applied to the semiconductor element may be input to a TCAD simulation tool. The structural data may include critical dimensions of the gate structure 510, the buried contact BC, the capacitor 540, and the like, a length of the channel region, and the like. The damage data may include the number of incidents of the damage DM predicted to occur in each of a plurality of positions defined in the semiconductor element along a first direction (e.g., a Z-axis direction).

The TCAD simulation tool may receive the structural data, the impurity concentration, the damage data, and the like, and may output electrical characteristics of the semiconductor element, for example, resistance of the semiconductor element. When the TCAD simulation tool outputs the resistance of the semiconductor element, at least one of the structural data, the impurity concentration, and the damage data may be changed and then input to the TCAD simulation tool, and thus, the resistance of the semiconductor element may be obtained.

Referring to FIG. 16, a number of incidents of the damage DM occurring in a semiconductor element, and respective positions thereof, may be changed. As an example, an intensity of radiation affecting a semiconductor device 500A and the number of neutrons incident on the semiconductor device 500A accordingly may be changed, and the number of particles generated from the changed number of neutrons may be calculated using a simulation tool, or the like. The newly calculated number of particles may be applied to the example embodiments described with reference to FIGS. 7 to 11 to change the positions and number of incidents of the damage DM. In other words, damage DM occurring in the semiconductor element of FIG. 16 may be understood to occur due to another aspect of radiation, as compared with the example embodiment illustrated in FIG. 15.

In the semiconductor device 500A according to the example embodiment illustrated in FIG. 16, a width of the gate structure 510A may be different from that of the gate structure 510 in the example embodiment illustrated in FIG. 15. Accordingly, the TCAD simulation tool, receiving damage data, structural data, and an impurity concentration defined in the example embodiment illustrated in FIG. 16, may output resistance having a magnitude different from a magnitude in the example embodiment illustrated in FIG. 15.

Referring to FIG. 17, a buried contact BC included in a semiconductor device 500B may have a critical dimension different from the critical dimensions in the example embodiments illustrated in FIGS. 15 and 16. Thus, a TCAD simulation tool, receiving damage data, structural data, and an impurity concentration defined in the example embodiment illustrated in FIG. 17, may output resistance having a magnitude different from the magnitudes in the example embodiments illustrated in FIGS. 15 and 16.

Similarly to the example embodiments described with reference to FIGS. 15 to 17, at least one of damage data, an impurity concentration, and structural data may be changed and then input to the TCAD simulation tool to generate a training data set. The generated training data set may be used to train a machine learning model to generate a defect prediction model.

Figure 18:
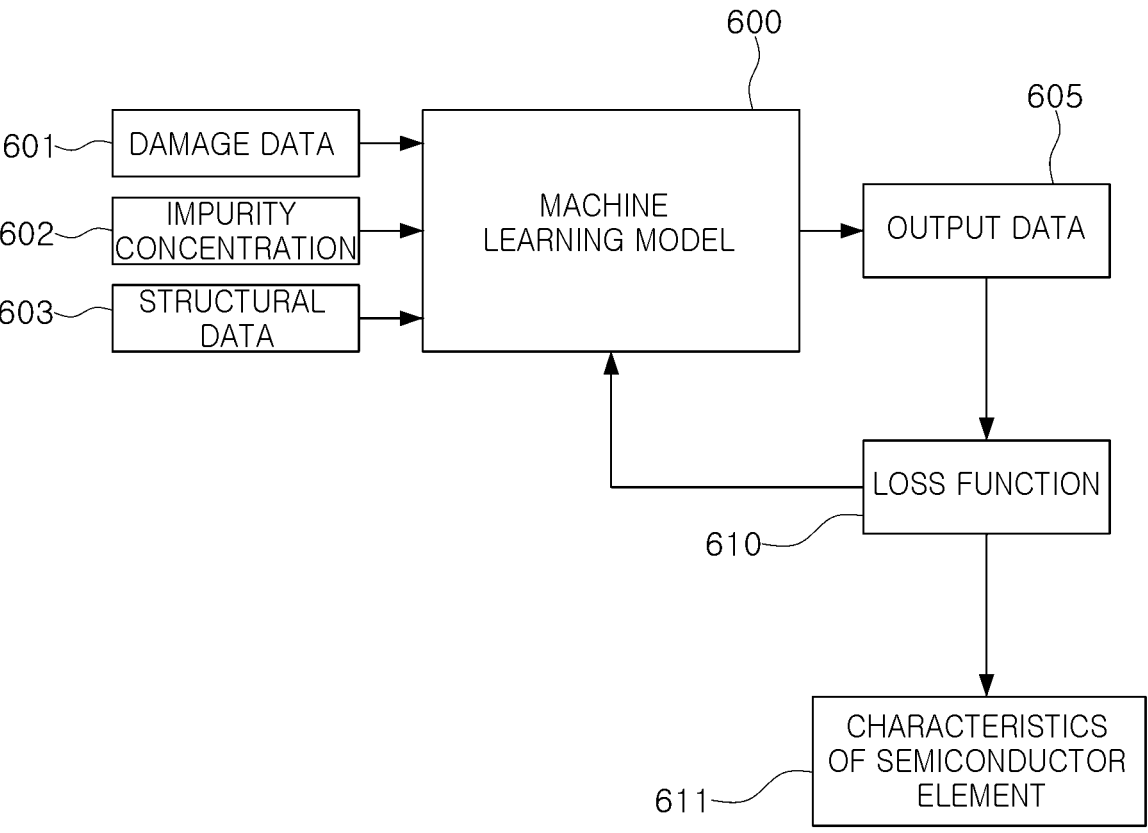
FIG. 18 is a diagram illustrating a defect prediction method using a defect prediction model according to an example embodiment of the present disclosure.

FIG. 18 is a diagram illustrating a defect prediction method using a defect prediction model according to an example embodiment of the present disclosure.

Referring to FIG. 18, a machine learning model 600 may receive input data such as damage data 601, impurity concentration 602, and structure data 603. The machine learning model 600 may include at least one artificial neural network, and may transmit output data 605 as an operation result of the artificial neural network.

The damage data 601, the impurity concentration 602, and the structural data 603, input to the machine learning model 600, may be data input to the TCAD simulation tool in the example embodiment described above with reference to FIG. 14. The output data 605, output by the machine learning model 600 receiving the damage data 601, the impurity concentration 602, and the structural data 603, may be compared with simulation data 611 by a loss function 610.

The simulation data 611 may be data obtained by applying the damage data 601, the impurity concentration 602, and the structural data 603 to a predetermined simulation tool to predict electrical characteristics of a semiconductor element before training the machine learning model 600. As an example, the simulation data 611 may be data including the electrical characteristics (for example, resistance) of the semiconductor element output by the TCAD simulation tool in the example embodiment described above with reference to FIG. 14. The loss function 610 may compare the output data 605 and the simulation data 611 with each other, and may train the machine learning model 600 based on a comparison result. In other words, the machine learning model 600 may be trained to predict the resistance of the semiconductor element caused by damage under the condition in which neutrons are incident in the semiconductor element to generate particles, and damage such as a vacancy defect, or the like, occurs in the semiconductor element due to the particles.

Training for the machine learning model 600 may be completed using a training data set including the input data, including the damage data 601, the impurity concentration 602, and the structural data 603, and the simulation data 611, and thus, a defect prediction model may be generated. The defect prediction model may receive damage data representing a position, the type, and the number of incidents of damage which may occur in a semiconductor element due to the intensity of radiation to which a semiconductor device may be exposed, structural data of a semiconductor element determined from a production process of a semiconductor device, an impurity concentration, and the like, to predict electrical characteristics (for example, resistance) of the semiconductor element.

Accordingly, a defect rate of defects, which may occur from radiation exposed to a semiconductor device when the semiconductor device is transported by an aircraft, or the like, according to structural data and a production process of the semiconductor device, may be rapidly predicted. As a result, structural data and a production process, which may significantly reduce a defect rate caused by the radiation, may be rapidly simulated and applied to an actual production process to improve quality and reliability of the semiconductor device. For example, the semiconductor device may be manufactured using the structural data and the production process generated by the machine learning model 600, which may be improved to provide greater protection from radiation damage.

Figure 19:
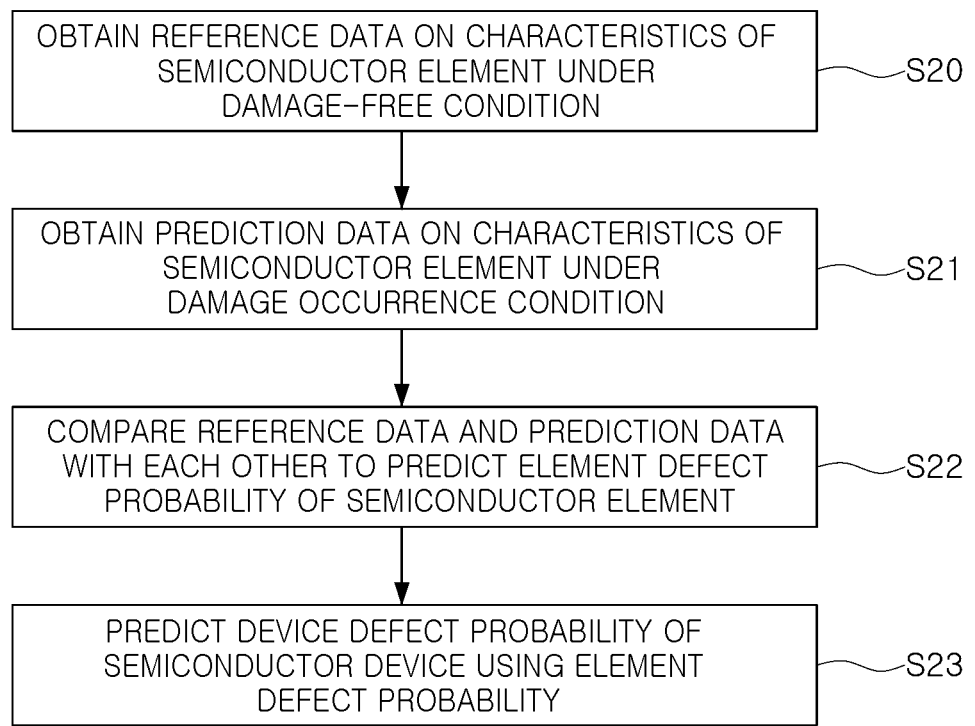
FIG. 19 is a flowchart illustrating a defect prediction method using a defect prediction model according to an example embodiment of the present disclosure.

FIG. 19 is a flowchart illustrating a defect prediction method using a defect prediction model according to an example embodiment of the present disclosure.

Referring to FIG. 19, a defect prediction method according to an example embodiment may start with an operation of obtaining reference data on characteristics of a semiconductor element under a damage-free condition (S20). As described above, a defect prediction model may be a machine learning model trained to predict the characteristics of the semiconductor element under conditions in which neutrons generated from radiation are incident on a semiconductor element to generate particles and damage occurs due to the particles. Accordingly, among the input data input to the defect prediction model, the damage data may not be input or a value of the damage data is set to be zero or null, so that characteristics of the semiconductor element may be obtained under a damage-free condition. In some embodiments, only the impurity concentration and the structural data, rather than the damage data, may be input to a TCAD simulation tool to obtain reference data.

Next, prediction data on the characteristics of the semiconductor element may be obtained under a damage occurrence condition (S21). In operation S21, the damage data may be input to the defect prediction model. The damage data may include a position in which damage will occur due to particles generated from neutrons incident on the semiconductor element, the number of incidents of damage, a position-dependent damage rate, and the like. In operation S21, the defect prediction model may receive a process distribution of the semiconductor element, structural data representing structural characteristics based on design data or the like, an impurity concentration, and the like, in addition to the damage data, and may output prediction data on the characteristics of the semiconductor element. The reference data and the prediction data, respectively obtained in operation S20 and operation S21, are data on the same electrical characteristics and may be, for example, data on resistance of the semiconductor element.

When the reference data and the prediction data are obtained, they may be compared with each other to predict a device defect probability of the semiconductor device (S22). The device defect probability may be a defect probability for a single semiconductor element. As an example, the device defect probability may be determined based on a probability that the prediction data has a value greater than a maximum value of the reference data or a reference value proximate to the maximum value of the reference data.

The device defect probability may be used to predict the device defect probability of the semiconductor device (S23). As an example, the device defect probability may be calculated using the number of semiconductor elements, included in a single semiconductor device, and the element defect probability. When the device defect probability is calculated, a module defect probability may be calculated in consideration of the number of semiconductor devices included in a semiconductor module.

In an example embodiment, a method of predicting a device defect probability may be as follows. As an example, a first probability may be calculated using the number of neutrons, which may be generated by radiation present in a transport route of the semiconductor device, and particles generated in the semiconductor device by the neutrons. The first probability may be defined as a probability that particles will be generated by radiation.

Next, a second probability may be calculated. The second probability is a probability that damage will occur due to the particles, and may be a probability considering that not all particles generated by radiation damage the semiconductor element.

Next, the third probability may be calculated using the reference data and the prediction data obtained from the defect prediction model. The third probability may be a probability that the semiconductor device is determined to be defective due to the damage under a damage occurrence condition. The element defect probability of the semiconductor element is determined as a product of the first to third probabilities. The device defect probability and the module defect probability based on the element defect probability may be defined as in Equation 1 below:

$$PD=1-(1-P)^N$$

$$PM=1-(1-PD)^M \qquad \text{<Equation 1>}$$

In Equation 1, P is an element defect probability, PD is a device defect probability, PM is a module defect probability, N is the number of semiconductor elements in a single semiconductor device, and M is the number of semiconductor devices included in a single semiconductor module. As an example, when a semiconductor device is a DRAM chip and a semiconductor module is a DIMM, N may be determined depending on capacity of the DRAM chip and M may be determined depending on the number of DRAM chips mounted on a substrate.

Figure 20:
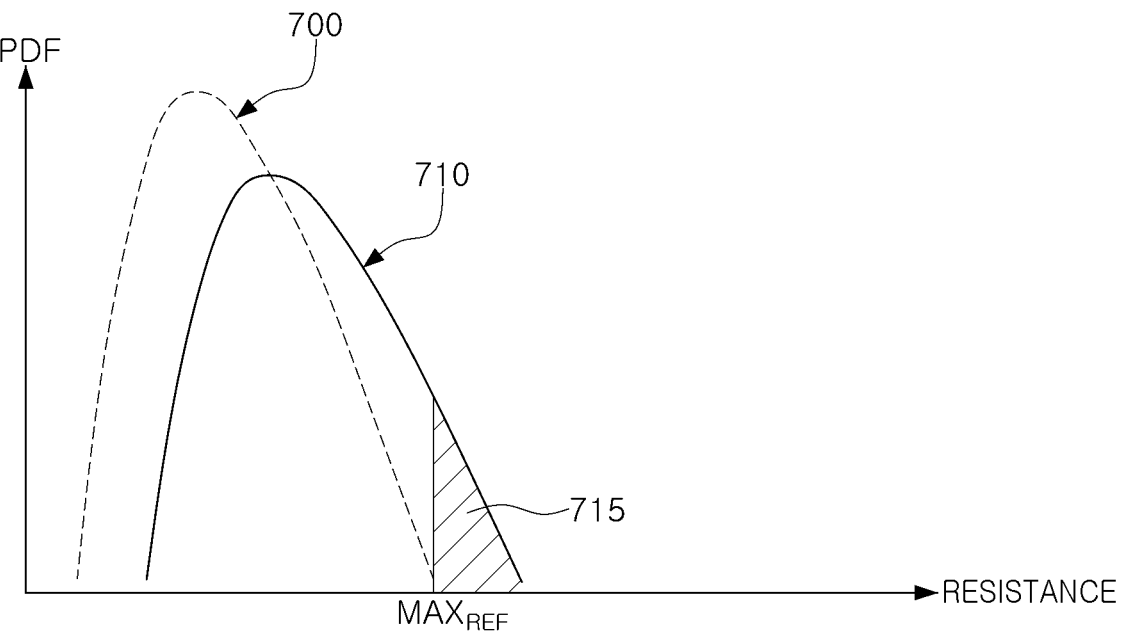
FIGS. 20 to 22 are diagrams illustrating a defect prediction method according to an example embodiment of the present disclosure.
Figure 21:
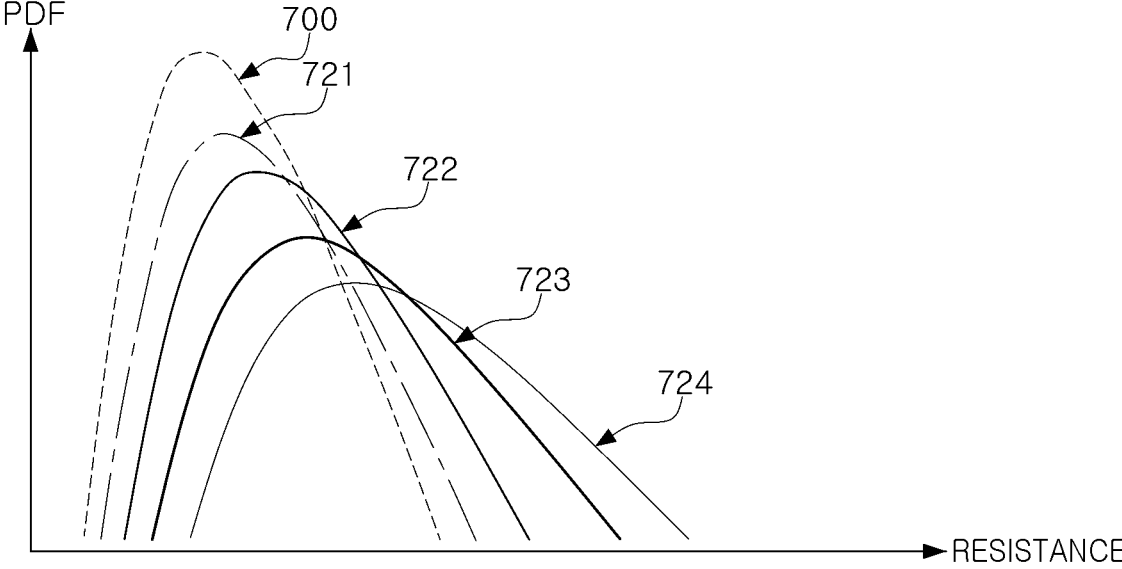
Figure 22:
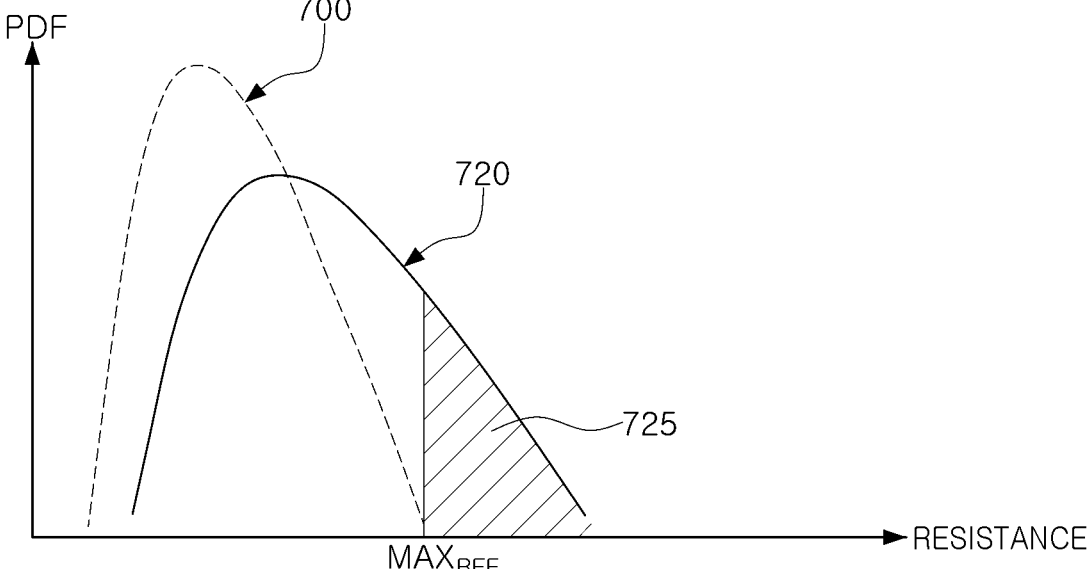

FIGS. 20 to 22 are diagrams illustrating a defect prediction method according to an example embodiment of the present disclosure.

In graphs illustrated in FIGS. 20 to 22, a horizontal axis may correspond to resistance, one of electrical characteristics of a semiconductor element, and a vertical axis may correspond to a probability distribution function (PDF). The graphs may include a reference graph corresponding to reference data obtained by inputting input data of conditions in which damage will not or does not occur to a defect prediction model, and a prediction graph corresponding to prediction data obtained by inputting input data of conditions in which damage occurs to the defect prediction model.

In FIG. 20, a reference graph 700 and a prediction graph 710 are illustrated.

Referring to FIG. 20, a distribution of resistance appearing in the reference graph 700 corresponding to the condition, in which damage will not occur, may be smaller than a distribution of resistance appearing in the prediction graph 710 corresponding to the condition in which damage occurred. In addition, a magnitude of the resistance appearing in the prediction graph 710 may be larger than a magnitude of the resistance appearing in the reference graph 700.

In the example embodiment illustrated in FIG. 20, a defect determination criterion may be a maximum value MAXREF of the reference graph 700. However, this is only an example, and a defect may be determined based on a value smaller than the maximum value MAXREF. Referring to FIG. 20, a probability 715 that a semiconductor device is defective in conditions in which damage occurred, may be determined based on a probability that resistance has a value greater than the maximum value MAXREF. For example, the probability 715 may correspond to the third probability, among the above-described first to third probabilities.

In FIG. 21, a single reference graph 700 and a plurality of prediction graphs 721 to 724 are illustrated. The plurality of prediction graphs 721 to 724 may be graphs illustrating resistance of a semiconductor element caused by damages occurring in a plurality of positions defined in the semiconductor element. As an example, the first prediction graph 721 may be a graph predicting a resistance distribution of a semiconductor element when damage occurs above a buried contact included in the semiconductor device, for example, in a landing pad, or the like. The second prediction graph 722 may be a graph predicting a resistance distribution of the semiconductor element when damage occurs in the buried contact. The third prediction graph 723 may be a graph predicting a resistance distribution of the semiconductor element when damage occurs between the buried contact and a channel region. The fourth prediction graph 724 may be a graph predicting a resistance distribution of the semiconductor element when damage occurs between the buried contact and the channel region. As described above, each of the first to fourth prediction graphs 721 to 724 may be obtained by adjusting a position in which damage occurred in the damage data among the input data of the defective prediction model.

As illustrated in FIG. 22, a single prediction graph 720 may be obtained by performing a convolution operation on the first to fourth prediction graphs 721 to 724. The prediction graph 720 and the reference graph 700 may be compared with each other to calculate a probability 725 that a semiconductor element is defective under conditions in which damage will occur due to particles. The probability 725 that the semiconductor element is defective may be a probability that resistance has a value greater than a reference value such as a maximum value MAXREF of the reference graph 700.

An element defect probability of the semiconductor element may be calculated by multiplying the probability 715 and 725 that the semiconductor element is defective by a probability that particles will be generated by radiation and a probability that damage will occur due to the particles. The element defect probability may be a probability that a single semiconductor element is defective, and a method of calculating a device defect probability and a module defect probability from the element defect probability may be understood with reference to Equation 1 above.

According to example embodiments, each of the first to fourth prediction graphs 721 to 724 may be compared with the reference graph 700 to calculate the probability that the semiconductor element is defective, without performing a convolution operation on the first to fourth prediction graphs 721 and 724. Thus, the probability that the semiconductor element is defective may be calculated in each of the first to fourth prediction graphs 721 to 724. In this case, the probability that the semiconductor element is defective may be calculated by multiplying a ratio of the number of incidents of damage to each of a plurality of positions corresponding to the first to fourth prediction graphs 721 to 724 by a probability calculated by comparing each of the first to fourth prediction graphs 721 to 724 with the reference graph 700 and summing values obtained by the multiplication. By multiplying the calculated probability by the probability that particles will be generated by radiation and the probability that damage will occur due to the particles, an element defect probability for a single semiconductor element may be determined.

FIG. 23 is a flowchart illustrating a defect prediction method according to an example embodiment of the present disclosure.

Referring to FIG. 23, a defect prediction method according to an example embodiment may start with an operation of calculating a first probability that particles will be generated and a second probability that damage will occur (S30). The first probability may be a probability that neutrons are incident into a semiconductor element due to radiation to which the semiconductor element is exposed and particles are generated by a nuclear fission reaction occurring in a semiconductor element, included in the semiconductor device, due to the neutrons. As an example, the neutrons may be absorbed in a material included in the semiconductor element to cause a nuclear fission reaction, and particles may be generated as a result of the nuclear fission reaction.

The second probability may be a probability that damage will occur due to the particles. The particles, generated as a result of the nuclear fission reaction, may have predetermined incident energy and may collide with a semiconductor material, impurities, or the like, to cause damage while moving within the semiconductor element. Since all of the particles do not cause damage, the second probability, a probability that damage will occur due to the particles, may be calculated.

Then, a training data set may be generated (S31). The training data set may include data for training a machine learning model to generate a defect prediction model and may be generated using, for example, input data including damage data, an impurity concentration, structural data, and the like, and simulation data obtained using a TCAD simulation tool. When the training data set is configured, the machine learning model may be trained to generate a defect prediction model (S32).

When the defect prediction model is generated, reference data and prediction data may be obtained using the defect prediction model (S33). As described above, the reference data may be data predicting electrical characteristics (for example, resistance) of the semiconductor element under conditions in which damage caused by the particles will not or does not occur, and the prediction data may be data predicting resistance of the semiconductor element under conditions in which the damage does occur due to the particles.

As described with reference to FIGS. 21 to 23, a third probability that a defect will occur in the semiconductor element may be calculated using the reference data and the prediction data (S34). The third probability may be calculated as a probability that the prediction data has a value greater than a maximum value of the reference data or a reference value proximate to the maximum value. The element defect probability of the semiconductor element may be calculated using the first probability, the second probability, and the third probability (S35). As an example, the element defect probability may be calculated by multiplying the first to third probabilities together.

A device defect probability may be calculated using the element defect probability (S36). In addition to the device defect probability, a module defect probability of a semiconductor module including a plurality of semiconductor devices may be calculated. As an example, the device defect probability and the module defect probability may be calculated by Equation 1 included herein.

Figure 24:
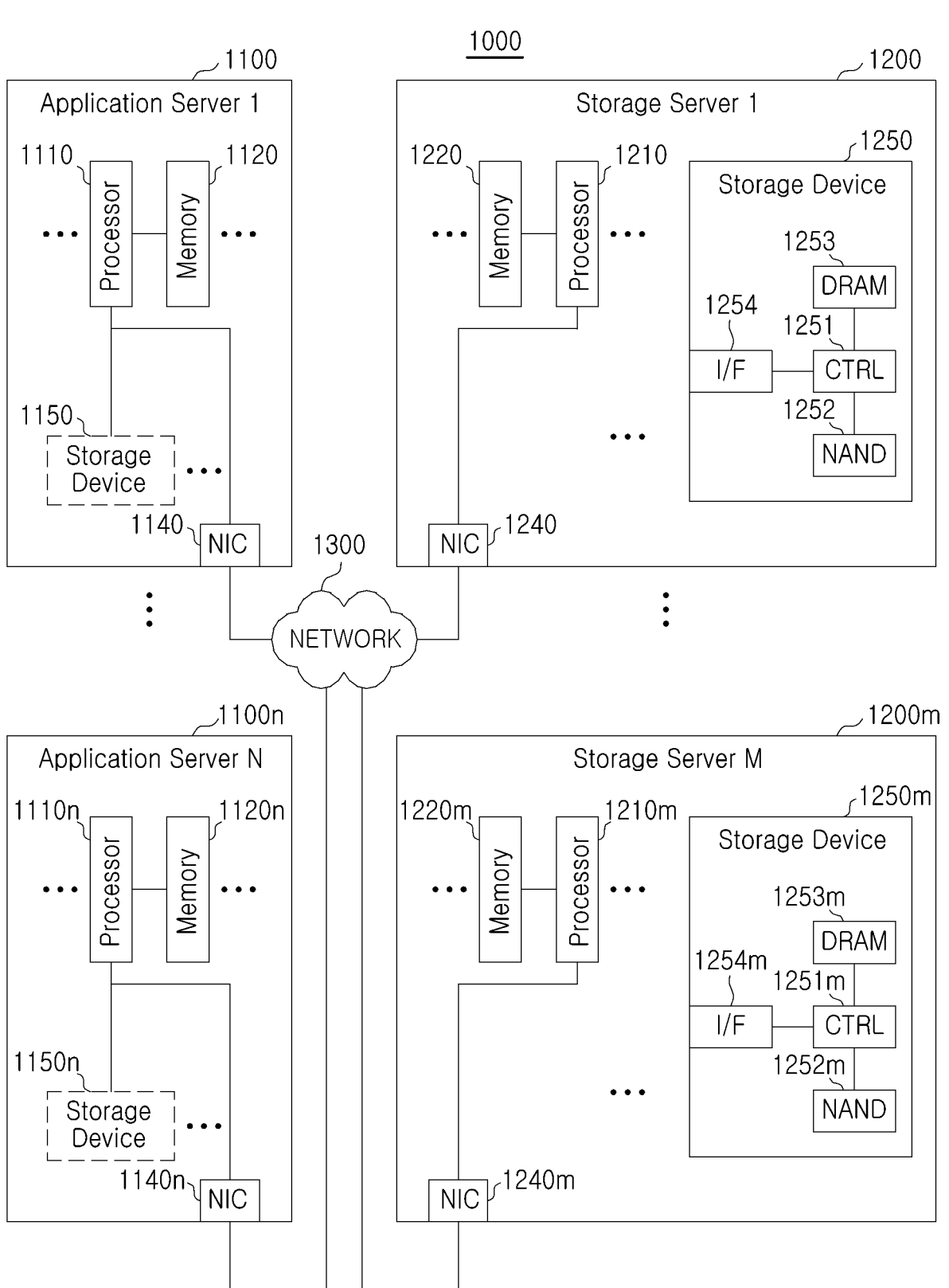
FIG. 24 is a schematic diagram of a server device to which a semiconductor device according to an example embodiment of the present disclosure is applied.

FIG. 24 is a schematic diagram of a server device to which a semiconductor device according to an example embodiment of the present disclosure is applied.

In the embodiment shown in FIG. 24, server devices 1100 to 1100$n$ and 1200 to 1200$m$ may configure a data center 1000 collecting and storing data and providing services. However, this is only an example embodiment, and the server devices 1100 to 1100$n$ and 1200 to 1200$m$ may be applied to various fields, other than the data center 1000.

The data center 1000 may be a facility, collecting various types of data and providing services, and may also be referred to as a data storage center. The data center 1000 may be a system for managing a search engine and database, and may be a computing system used in a company or a government agency. The data center 1000 may include application servers 1100 to 1100$n$ and storage servers 1200 to 1200$m$. The number of application servers 1100 to 1100$n$ and the number of storage servers 1200 to 1200$m$ may be variously selected according to example embodiments, and the number of application servers 1100 to 1100$n$ and storage servers 1200 to 1200$m$ may be different from each other.

An application server 1100 or a storage server 1200 may include processors 1110 and 1210 and memory devices 1120 and 1220. To describe the storage server 1200 as an example, the processor 1210 may control operations of the storage server 1200 and may access the memory 1220 to execute a command and/or data loaded in the memory 1220. The memory 1220 may include at least one of a double data rate synchronous DRAM (DDR SDRAM), a high bandwidth memory (HBM), a hybrid memory cube (HMC), a dual in-line memory module (DIMM), an optane DIMM, or a non-volatile DIMM (NVMDIMM).

According to example embodiments, the number of processors 1210 and the number of memory devices 1220 included in the storage server 1200 may be variously selected. For example, one storage server 1200 may include two or more processors 1210. In addition, the number of memory devices 1220 included in one storage server 1200 and a method of connecting the processor 1210 and the memory 1220 to each other may be determined depending on capacity of data to be processed by the storage server 1200, data processing speed that should be supported by the storage server 1200, and the like.

The description of the storage server 1200 may be similarly applied to the application server 1100. According to example embodiments, the application server 1100 may not include the storage device 1150. The storage server 1200 may include at least one storage device 1250. The number of storage devices 1250, included in the storage server 1200, may be variously selected according to example embodiments.

The application servers 1100 to 1100n and the storage servers 1200 to 1200m may communicate with each other through a network 1300. The network 1300 may be implemented using protocols such as Fibre Channel (FC), Ethernet, or the like, and may be connected to the servers 1100 to 1100n and 1200 to 1200m through NICs 1140 to 1140n and 1240 to 1240m included in respective ones of the servers. The NICs 1140 to 1140n and 1240 to 1240m may include a network interface card, a network adapter, and the like.

In the example embodiment illustrated in FIG. 24, the storage device 1250 of the storage server 1200 may provide a physical connection between the processor 1210 and the controller 1251 and a physical connection between the NIC 1240 through the interface 1254. The interface 1254 may be implemented by a direct attached storage (DAS) method in which the storage device 1250 is directly connected to an exclusive cable. In addition, the interface 1254 may be implemented in various interface manners such as Advanced Technology Attachment (ATA), Serial ATA (SATA), external SATA (e-SATA), Small Computer System Interface (SCSI), Serial Attached SCSI (SAS), Peripheral Component Interconnect (PCI), PCI express (PCIe), NVM Express (NVMe), IEEE 1394, universal serial bus (USB), secure digital (SD) card, multi-media card (MMC), embedded multi-media card (eMMC), Universal Flash Storage (UFS), Embedded Universal Flash Storage (eUFS), CompactFlash (CF) card interface, and the like.

The controller 1251 may control operations of the storage device 1250. In an example embodiment, the controller 1251 may include static random access memory (SRAM). The controller 1251 may write data in a NAND flash memory 1252 in response to a program command, and may read data from the NAND flash memory 1252 in response to a read command. For example, a program command and/or a read command may be provided from a processor 1210 in the storage server 1200, a processor 1210m in another storage server 1200m, processors 1110 to 1110n in the application server 1100 to 1100n, or the like. The storage device 1250 may include DRAM 1253 and NAND flash memory 1252. The DRAM 1253 may temporarily store data to be written in the NAND flash memory 1252 and/or data read from the NAND flash memory 1252. Also, the DRAM 1253 may store metadata. The metadata may be user data or data generated by the controller 1251 to manage the NAND flash memory 1252. The storage device 1250 may include a secure element (SE) for security or privacy.

The server devices 1100 to 1100n and 1200 to 1200m, constituting the data center 1000, may have significantly high reliability, so that each of the processors 1110 and 1210, the memories 1120 and 1220, and the storage device 1250 may also have high reliability. When the data center 1000 to which semiconductor devices such as the processors 1110 and 1210, the memories 1120 and 1220, and the storage devices 1250 are applied is managed overseas, the semiconductor devices may be transported overseas through air transportation. During the transportation of the semiconductor devices, defects may occur in the semiconductor devices due to radiation. Since defects occurring due to radiation during the air transportation are defects occurring after production and shipment, it may be difficult to predict and respond to such defects in a production stage.

As described above, according to example embodiments of the present disclosure, an element defect probability of a semiconductor element may be calculated using a probability that predetermined particles generated by radiation reach the semiconductor element and a probability that the semiconductor element is determined to be defective when damage does occur. In addition, a defect probability of a semiconductor device, a semiconductor module, a semiconductor package, or the like, may be calculated using the element defect probability. An element defect probability may be calculated using a defect prediction model trained in consideration of a position in which damage occurs due to particles, a process distribution, and the like. Thus, a probability of occurrence of a defect in the semiconductor device due to radiation may be accurately predicted.

While example embodiments have been shown and described above, it will be apparent to those of ordinary skill in the art that modifications and variations could be made without departing from the scope of the present inventive concepts as defined by the appended claims.

What is claimed is:

1. A method for predicting a defect in a semiconductor device, the method comprising:

calculating a first probability that particles will be generated in a semiconductor element of the semiconductor device by radiation;

calculating a second probability that damage will occur in the semiconductor element due to the particles;

generating a training data set using input data and simulation data, the input data comprising damage data generated using the first probability and the second probability and comprising at least one of a position in which the damage will occur and an amount of the damage, an impurity concentration of impurities doped in at least a portion of the semiconductor element, and structural data of the semiconductor element, and the simulation data comprising electrical characteristics of the semiconductor element obtained as a result of a simulation based on the input data;

training a machine learning model based on the training data set to generate a defect prediction model;

applying the defect prediction model to a design of the semiconductor device to generate a defect prediction output;

generating an updated design of the semiconductor device based on the defect prediction output of the defect prediction model; and manufacturing the semiconductor device based on the updated design.

2. The method of claim 1, wherein the semiconductor element is a memory cell comprising a transistor and a capacitor.

3. The method of claim 2, wherein the capacitor comprises a lower electrode, a dielectric layer, and an upper electrode, and the upper electrode comprises a semiconductor material.

4. The method of claim 2, wherein the electrical characteristics of the semiconductor element comprise a resistance value of the memory cell while the transistor is turned on.

5. The method of claim 1, wherein the first probability is calculated using a number of the particles generated in the semiconductor element by radiation, as compared with a number of neutrons incident on the semiconductor element.

6. The method of claim 5, wherein the number of the neutrons and the number of the particles are predicted using a simulation tool using a radiation transport code.

7. The method of claim 1, wherein a plurality of positions are defined in the semiconductor element, and the second probability is predicted for each of the plurality of positions using a simulation tool.

8. The method of claim 7, wherein the plurality of positions are defined in a first direction that is perpendicular to an upper surface of a semiconductor substrate of the semiconductor device.

9. The method of claim 7, wherein the second probability varies depending on an amount of a semiconductor material included in each of the plurality of positions.

10. The method of claim 1, wherein the structural data comprises at least one of a length of a channel of the semiconductor element, a critical dimension of a gate included in the semiconductor element, a critical dimension of a capacitor included in the semiconductor element, and a critical dimension of a buried contact connecting the capacitor to an active region.

11. The method of claim 1, wherein the input data is input to a technology computer aided design (TCAD) simulation tool that is configured to calculate resistance of the semiconductor element, and the resistance of the semiconductor element calculated by the TCAD simulation tool is at least a portion of the simulation data used to generate the training data set.

\* \* \* \* \*